United States Patent [19]

Renner et al.

[11] Patent Number: 4,740,906

[45] Date of Patent: Apr. 26, 1988

[54] DIGITAL LATTICE FILTER WITH MULTIPLEXED FAST ADDER/FULL ADDER FOR PERFORMING SEQUENTIAL MULTIPLICATION AND ADDITION OPERATIONS

[75] Inventors: Karl H. Renner, Dallas; Alec J. Morton, Plano, both of Tex.

[73] Assignee: Texas Instruments Incorporated, Dallas, Tex.

[21] Appl. No.: 646,381

[22] Filed: Aug. 31, 1984

[51] Int. Cl.⁴ .......................... G06F 15/31; G10L 1/00
[52] U.S. Cl. ........................................ 364/724; 381/51
[58] Field of Search .................. 364/724, 760; 381/51

[56] References Cited

U.S. PATENT DOCUMENTS

| | | | |
|---|---|---|---|
| 4,209,844 | 6/1980 | Brantingham et al. | 364/724 |
| 4,319,084 | 3/1982 | Lucchini et al. | 381/51 |
| 4,340,781 | 7/1982 | Ichikawa et al. | 364/724 |
| 4,344,148 | 8/1982 | Brantingham et al. | 364/724 |
| 4,352,162 | 9/1982 | Nyuji et al. | 364/724 |
| 4,392,018 | 7/1983 | Fette | 381/51 |
| 4,398,262 | 8/1983 | Williams | 364/724 |
| 4,443,859 | 4/1984 | Wiggins | 364/724 |
| 4,554,858 | 11/1985 | Wachi et al. | 364/724 |
| 4,597,053 | 6/1986 | Chamberlin | 364/760 |

FOREIGN PATENT DOCUMENTS 2103458 2/1983 United Kingdom ................. 381/51

*Primary Examiner*—David H. Malzahn
*Attorney, Agent, or Firm*—Leo N. Heiting; N. Rhys Merrett; Melvin Sharp

[57] ABSTRACT

A lattice filter for processing lattice equations includes a fast adder (78) for adding partial products to partially perform a multiplication step. A full adder (44) is provided for completing the multiplication and then adding the product with a previously calculated and stored value. The input to the full adder (44) is multiplexed with a multiplexer (74) for selecting the sum output of the fast adder (78) and a multiplexer (76) for selecting the carry output of the fast adder (78). The multiplexer (74) also selects prestored values for addition with the summed output of the full adder (44). This summed output is selected by the multiplexer (76). The fast adder (78) sums partial products simultaneous with addition operations of the full adder (44). In this manner, the full adder (44) operates at a slower rate than the fast adder (78). Storage registers (58), (62), (70) are utilized to delay results output by the full adder (44) for later selection and operation thereon. These values are utilized as both the multiplicand the addend in subsequent operations. The multiplier is stored in a K-stack (90) and selected for the appropriate operations. A bit correction circuit (190) provides corrections for truncated bits in the form of a carry input to the full adder (44).

22 Claims, 4 Drawing Sheets

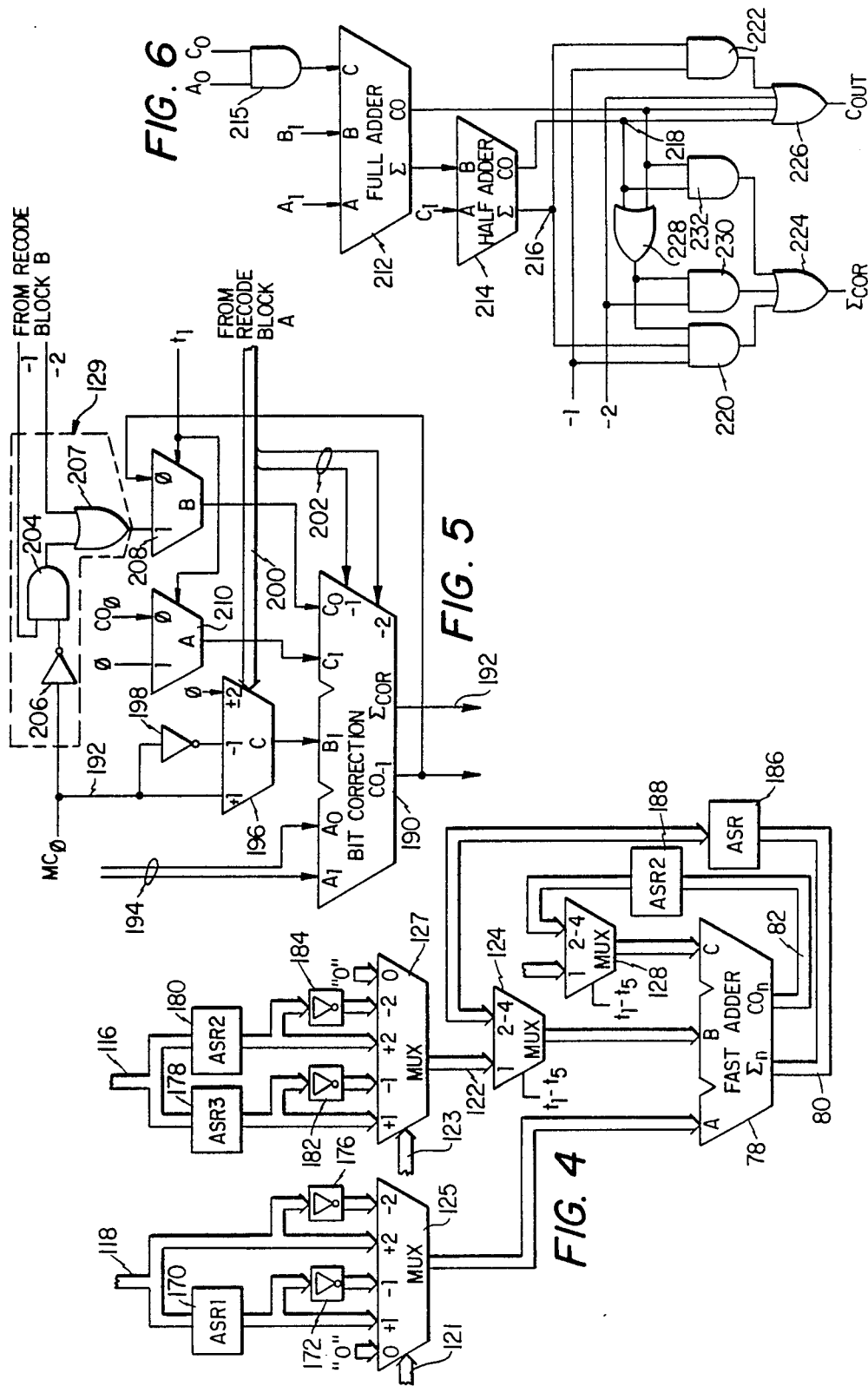

4,740,906

DIGITAL LATTICE FILTER WITH MULTIPLEXED FAST ADDER/FULL ADDER FOR PERFORMING SEQUENTIAL MULTIPLICATION AND ADDITION OPERATIONS

TECHNICAL FIELD OF THE INVENTION

The present invention pertains in general to the processing of arithmetic operations and, more particularly, to the processing of arithmetic operations in digital lattice filters utilized for speech synthesis.

CROSS REFERENCE TO RELATED APPLICATIONS

This application is related to patent application Ser. Nos. 646,868, filed Aug. 31, 1984, 646,869, and 646,401, filed Aug. 31, 1984.

BACKGROUND OF THE INVENTION

Generation of complex synthesized sounds such as speech require some form of voice compression. One voice compression technique that has been heretofore utilized is linear predictive coding (LPC). LPC utilizes a digital lattice filter to model human speech from a set of prestored input parameters contained in a Read Only Memory (ROM). The LPC lattice filter typically is comprised of ten stages with each stage requiring two multiplications and two additions before passing the results backwards and forwards to its neighboring stages. The operations in the ten stages are carried out sequentially, as are the four operations within each stage. Processing of each prestored input parameter through the lattice filter results in a digital output value which is converted to an analog signal level and then amplified for output to a speaker or similar transducer.

In order to synthesize high quality speech with a digital lattice filter, it is necessary to process the prestored input parameters through the lattice filter at a repetition rate of approximately 10 KHz. To operate the lattice filter at this repetition rate, each stage must perform the digital operations therein within ten microseconds. Each of the digital addition and/or subtraction operations required for each stage utilizes a relatively straight forward process, whereas the digital multiplication operation is somewhat more complicated. Multiplication of two binary values requires iterative processing which may require up to four separate additions to yield a product, depending upon the length of the digital values multiplied. The processing of the two multiplications and two additions for each stage can therefore require the generation of up to ten seperate sums.

Heretofore, the two multiplications and two additions for each stage have been performed in a parallel fashion with five sums being simultaneously generated. In this manner, circuitry with a relatively slow response time can be utilized. However, to perform this parallel operation, five full adders are required resulting in a large parts count. This large parts count requires a significant amount of silicon surface area in order to realize the circuitry for the five full adders and the peripheral control circuitry necessary to support this number of full adders. From a cost and manufacturing standpoint, it would be desirable to utilize less circuitry to perform the same operation. Therefore, there exists a need for a circuit to process the multiplications and additions/subtractions required in each stage of the digital filter which is reliable with less circuitry without sacrificing processing time.

SUMMARY OF THE INVENTION

The present invention disclosed and claimed herein comprises a method and apparatus for processing a sequence of arithmetic operations at a high speed with a minimum of circuitry to yield a final result. The apparatus includes a storage medium for storing arithmetic parameters for use in processing the arithmetic operations. These arithmetic parameters are accessible to allow selection of two of the parameters as a multiplicand and multiplier for a multiplication operation and one of the parameters as an addend for an addition operation. The partial products of the multiplicand and multiplier are generated according to a predetermined algorithm and these partial products are added with a fast adder to generate an accumulated sum and carry word. A full adder is also provided having first and second inputs for receiving two digital values and generating the sum thereof. The full adder is multiplexed to add the accumulated sum and carry word from the fast adder to generate the product of the multiplier and multiplicand and then sequentially add the addend to the generated product to yield the result for the arithmetic operation being processed. A timing circuit times the operation of the fast adder and the multiplexing operation of the full adder such that the fast adder is processing the partial products for the next sequential arithmetic operation while the full adder is generating both the product of the multiplier and multiplicand and the final result for the arithmetic operation being processed.

In yet another embodiment of the present invention, the multiplier is stored in a rotary data register and the results of the intermediate arithmetic operations are stored in a delay register stack as multiplicands and addends for subsequent operations. The output of the delay register stack is accessed to selectively provide both the multiplicand and the addend for processing the subsequent arithmetic operations. The amount of delay provided for either the multiplicand or the addend is determined by the sequence in which the arithmetic operations are to be performed and the particular operation that is being performed. The final result is stored in a separate data register after all of the arithmetic operations in the sequence have been processed.

BRIEF DESCRIPTION OF THE DRAWINGS

For a more complete understand of the present invention and the advantages thereof, reference is now made to the following description taken in conjunction with the accompanying Drawings in which:

FIG. 3 illustrates a schematic block diagram of the recode logic utilized to generate the modified Booth's operators;

FIG. 4 illustrates a schematic block diagram of the multiplexers associated with the fast adder;

FIG. 5 illustrates a schematic block diagram of the bit correction logic circuit;

FIG. 6 illustrates a detailed schematic diagram of the bit correction logic circuit of FIG. 5; and FIG. 7 illustrates a block diagram of the timing circuit for generating the fast and slow clocks

DETAILED DESCRIPTION OF THE INVENTION

Figure 1:
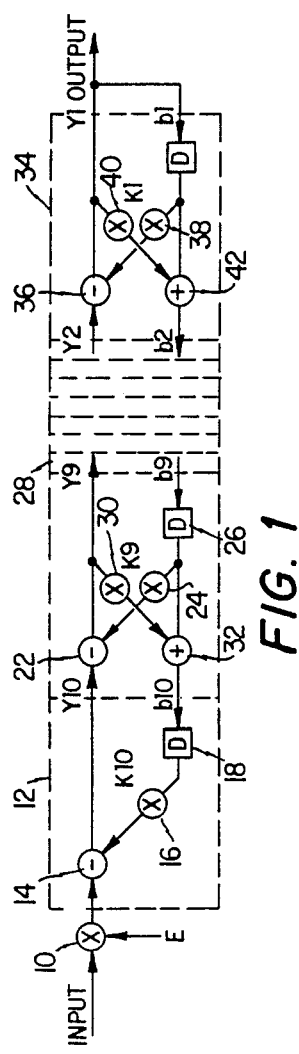
FIG. 1 illustrates a functional block diagram of a ten stage lattice filter showing the sequence of the arithmetic operations to be performed.

Speech synthesis utilizing a ten stage lattice filter requires processing of a prestored value through all ten stages of the lattice filter within a predetermined duration of time. Each stage of the lattice filter has two sets of equations, one for generating the "Y-value" and the other for calculating the reflection coefficient or "B-value". Both the Y and B-values are calculated with equations consisting of one multiplication step followed by an addition or subtraction step. There are twenty separate equations required to calculate all of the Y- and B-values, each equation depending upon the results from a previous equation. These equations are illustrated in Table 1.

TABLE 1

| | |
|---|---|
| $Y10_i = EI_i - k10b10_{i-1}$ | (1) |
| $Y9_i = Y10_i - k9b9_{i-1}$ | (2) |
| $Y8_i = Y9_i - k8b8_{i-1}$ | (3) |
| $Y7_i = Y8_i - k7b7_{i-1}$ | (4) |
| $Y6_i = Y7_i - k6b6_{i-1}$ | (5) |
| $Y5_i = Y6_i - k5b5_{i-1}$ | (6) |
| $Y4_i = Y5_i - k4b4_{i-1}$ | (7) |
| $Y3_i = Y4_i - k3b3_{i-1}$ | (8) |
| $Y2_i = Y3_i - k2b2_{i-1}$ | (9) |
| $Y1_i = Y2_i - k1b1_{i-1}$ | (10) |
| $b10_i = b9_{i-1} + k9Y9_i$ | (11) |
| $b9_i = b8_{i-1} + k8Y8_i$ | (12) |
| $b8_i = b7_{i-1} + k7Y7_i$ | (13) |
| $b7_i = b6_{i-1} + k6Y6_i$ | (14) |
| $b6_i = b5_{i-1} + k5Y5_i$ | (15) |
| $b5_i = b4_{i-1} + k4Y4_i$ | (16) |
| $b4_i = b3_{i-1} + k3Y3_i$ | (17) |
| $b3_i = b2_{i-1} + k2Y2_i$ | (18) |
| $b2_i = b1_{i-1} + k1Y1_i$ | (19) |
| $b1_i = Y1_i$ | (20) |

The input energy level is represented by "E" and this is generated either internally from prestored parameters or from an external source. A term "$I_i$" represents the input excitation value which is representative of random noise that is utilized to facilitate generation of hissing sounds that are made by the spoken voice or periodic voiced sounds. A number of constants are provided that are prestored and labeled k1 through k10. The constants k1 through k10 describe the characteristics of the equations that correspond to the shape of the mouth and the position of the tongue and teeth in order to allow generation of the various sounds corresponding to speech. An additional set of parameters labeled b1 through b10 are provided that are generated in a previous sample time and are utilized to sequentially calculate the values that are labeled Y1 through Y10.

Initially, the value for $Y10_i$ is calculated according to Equation 1 utilizing the product of the input energy level and the excitation source, the value of k10 and the previously calculated value of b10. The previously calculated value for b10 is represented by the subscript "i-1". Values for $Y9_i$ are then calculated according to Equations 2-10, with $Y1_i$ being equal to the final result for the i'th sample time. The B-values are then calculated according to Equations 11-20 by utilizing both the calculated Y1 through 10 values for that sample time and the previously calculated b1 through b9 values. These new B-values are stored for use in calculation of the Y-values during the next sample time.

Referring now to FIG. 1, there is illustrated a functional diagram of a ten stage lattice filter for calculating the twenty equations in Table 1. The input energy is input to a multiplication block 10 which also receives the excitation energy E to generate a product therefor. This product EI is input to a first stage 12 of the digital filter to a subtraction block 14. The subtraction block 14 subtracts the product EI from the product generated by a multiplication block 16. The multiplication block 16 receives a delayed value of b10 which is delayed through a delay block 18 and multiplies it by the constant k10. The output of the subtraction block 14 is labeled Y10. Y10 is input to a second stage of the digital filter to a subtraction block 22. The subtraction block 22 receives a product from a multiplication block 24 which is the product of k9 and the delayed value of b9 which is delayed through a delay block 26. The output of the subtraction block 22 is the value Y9 which is input to a third stage 28 of the digital filter.

The generated Y9 value is also input to a multiplication block 30 for multiplication by the constant k9 and then summed with the delayed value of b9 in a summation block 32. This summation block outputs the value of b10 which is then input to the delay block 18. The delay block 18 represents the delay for one sample time.

The third stage 28 performs a similar calculation as the second stage 20 except that it utilizes the constant k8. Subsequent stages calculate the values Y8 through Y2 with a final tenth stage 34 calculating the Y1-value. The tenth stage 34 receives the Y2-value at the input of a subtraction block 36 to subtract it from the product output by a multiplication block 38. The product generated by the multiplication block 38 is the product of thhe delayed value b1 and the constant k1. In addition, Y1 is input to a multiplication block 40 for multiplication by the constant k1, the product thereof input to an addition block 42 for addition with the delayed value of b1. The output is the value b2.

In order to process the input energy I through the 10 stage lattice filter, it is necessary to process the Equations 1-20 individually. Each of these equations requires one multiplication and one addition or subtraction step. If, for example, the sampling rate is 10 kHz, the processing rates for each of the equations is 200 kHz. Therefore, the multiplication and addition operations must be performed at a rate greater than 200 kHz.

In accordance with the present invention, multiplication is performed with a combined fast adder and full adder wherein the fast adder is utilized to sum the individual bits of each of the partial products to generate an accumulated sum. The carrys are not propagated but, rather, accumulated for each accumulated sum bit. By not propagating carrys from one bit to another, faster summation is achieved. The full adder is utilized to add the accumulated sum and carry words to provide the final result or product. Since the full adder is only used at the end of the summation process in the fast adder, the operation of the full adder is multiplexed to perform other addition operations required for each of the equations being processed during the time that the fast adder is summing partial products. The operations performed by the full adder during addition of the partial products by the fast adder are the summation of accumulated sum and carry words previously generated by the fast adder and summation of the addend with the resulting product. Therefore, the full adder performs two additions during the same time the fast adder is summing partial products. With multiplexing, only one full adder and one fast adder are utilized wherein the response time for the full adder is less than that required for a fast adder. Since it is not necessary to propagate carrys across the bits in the faster adder, circuitry utilized to implement the fast adder is less complicated and speed is not so critical.

Figure 2:
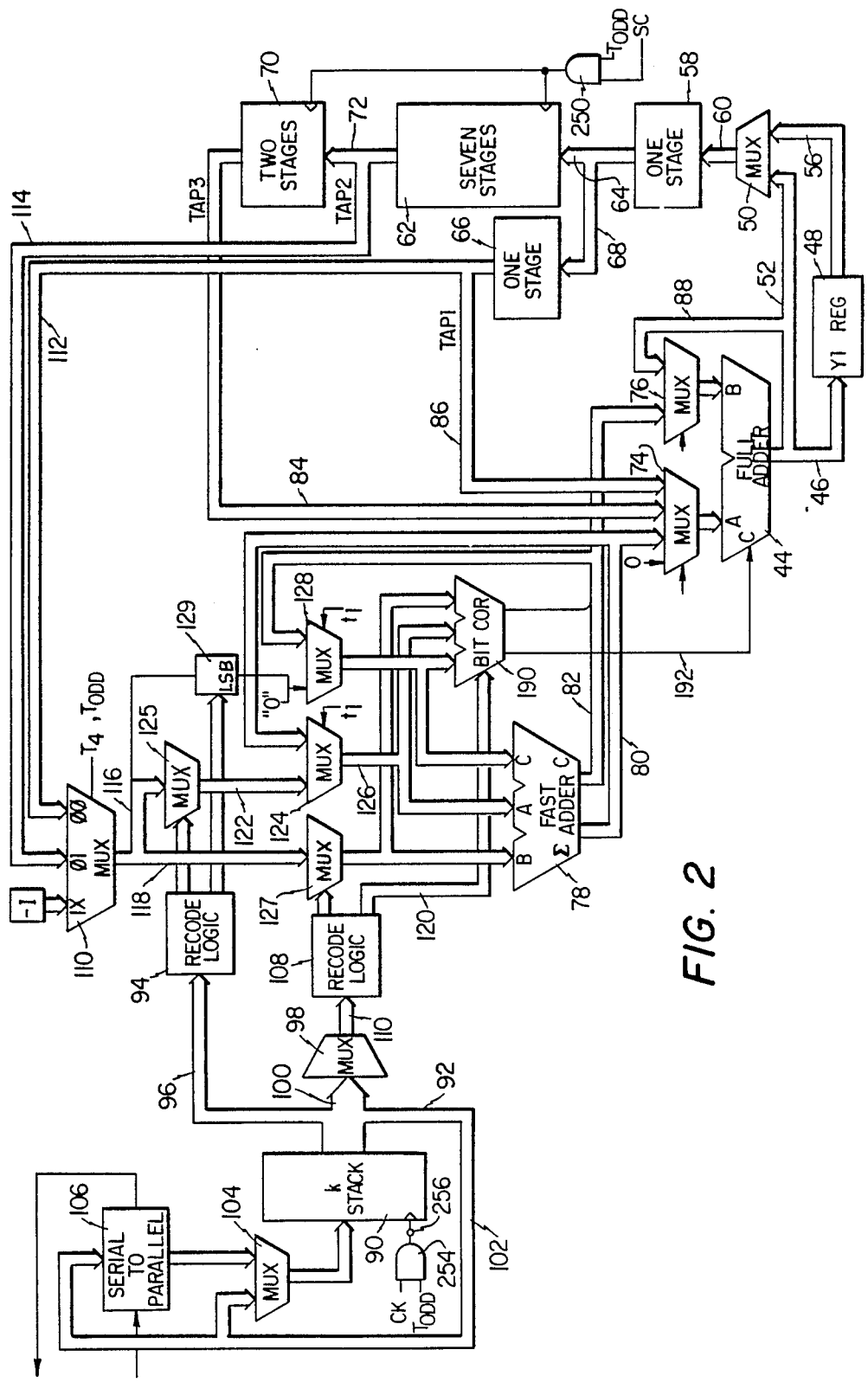
FIG. 2 illustrates a schematic block diagram of the system for performing the multiplication and addition steps with a fast adder and a full adder.

Referring now to FIG. 2, there is illustrated a schematic diagram of a system for processing Equations 1–20 of Table 1. A full adder 44 has two inputs labeled "A" and "B" for receiving two digital values and providing the sum on the output thereof. In addition, the full adder 44 has a carry input labeled "C". The output of the full adder is connected to a data bus 46 which is input to a Y-register 48 for storing the output value therefrom at a selected time, as will be described hereinbelow.

A mulitplexer 50 has one input thereof connected to the data bus 46 through a data bus 52 and the other input thereof connected to the output of the Y-register through a data bus 56. The output of the multiplexer is connected to the input of a one stage register 58 through a connecting bus 60. The output of the one stage data register 58 is connected to the input of a seven stage register stack 62 through a connecting bus 64. The output of the one stage data register 58 is also connected to the input of a one stage data register 66 through a connecting bus 68. The output of the seven stage register stack 62 is input to a two stage register stack 70 through a connecting bus 72.

The one stage data register 58 provides one stage of delay for data that is selected from the output of either the full adder 44 or the Y-register 48. The one stage data register 66 provides an additional stage of delay, resulting in a combined two stage delay register for processing of data therethrough. In a similar manner, the seven stage register stack 62 provides a total of eight stages of delay when combined with the one stage data register 58, and the two stage data register stack 70 provides a total of ten stages of delay when combined with both the seven stage register stack 62 and the one stage delay register 58. As will be described hereinbelow, the output values from the full adder 44 are temporarily stored for use in another arithmetic operation.

The A-input of the full adder 44 is connected to the output of a multiplexer 74 and the B-input of the full adder 44 is connected to the output of a multiplexer 76. The multiplexer 74 has one input thereof connected to a data word comprised of bits having a "0" value and one input thereof connected to the summed output of a fast adder 78 through a connecting bus 80. The multiplexer 74 has two remaining inputs, one of which is connected to the output of the two stage register stack 70 through a connecting bus 84 and the other of which is connected to the output of the one stage data register 66 through a connecting bus 86. The multiplexer 76 has one input thereof connected to the carry output of the fast adder 78 through a connecting bus 82 and the remaining input thereof connected to the data bus 46 on the output of the full adder 44 through a connecting bus 88. The multiplexers 74 and 76 operate in one mode to sum the data output by the fast adder 78 on the sum and carry outputs thereof with the full adder 44. In another mode, this sum output from the fast adder 78 is input to the B-input of the full adder 44 and a delayed value selected from the output of either the two stage register stack 70 or the one stage data register 66 to provide a sum therefor.

The fast adder 78 is a device which sums three digital values by summing the individual bits thereof without propagating carrys between adjacent bits. However, the carry bit is provided on a separate output from the fast adder 78. To sum partial products with the fast adder 78, a multiplexed operation is utilized to sequentially sum the partial products with the previously generated carry. First, the first two partial products are summed to provide a first accumulated sum and carry word and then this first accumulated sum and carry word are added to the third partial product. This is continued until the last partial product is added with the preceding accumulated sum and carry words. The final accumulated sum and carry words are input to the full adder through multiplexers and summed to provide a product. This technique of multiplication is described in more detail in "A CMOS Floating Point Multiplier", Masaru Uya et al, IEEE International Solid State Circuits Conference, 1984, pages 90–91.

The multipliers are constants which are stored in a ten bit wide eleven stage register stack 90, hereinafter referred to as the "K" stack. Data contained on top of the K stack 90 is output onto a ten bit wide data bus 92 which has the first two bits thereof input to a recode logic circuit 94 through a two bit wide data bus 96, and the remaining eight bits thereof input to a multiplexer 98 through an eight bit wide data bus 100.

The output data on the data bus 92 is also recirculated back to the input of the K stack 90 through a return data bus 102 that is connected to one input of a multiplexer 104. The output of the multiplexer 104 is connected to the input of the K stack 90. The multiplexer 104 has the other input thereof connected to the output of a serial-to-parallel converter 106 which has the input thereof connected to the return data bus 102. The multiplexer 104 is operable to select between data output by the serial-to-parallel converter 106 or data output from the K stack 90. In addition, the serial-to-parallel converter 106 is operable to receive data from the return data bus 102 and output serial data to an external location.

The multiplexer 98 has the output thereof connected to a recode logic circuit 108 through a two bit wide data bus 109. The multiplexer 98, as will be described hereinbelow, selects between pairs of the eight bits input thereto for input to the recode logic circuit 108. The recode logic circuits 94 and 108 are operable to generate operators which determine the operations to be performed on the multiplicand to generate partial products in accordance with a predetermined algorithm. In the preferred embodiment, multiplication is performed using a modified Booth's algorithm. In the modified Booth's algorithm, three bit segments of the multiplier, with one overlapping bit between adjacent segments, are analyzed and a predefined operation performed on the multiplicand. This modified multiplicand is termed a "partial product". For a ten bit multiplier, five partial products will be generated and they are termed $PP_1$, $PP_2$, $PP_3$, $PP_4$, and $PP_5$.

The multiplicand is selected by a multiplexer 110 which has three inputs, one connected to the output of the one stage register 66 through a connecting bus 112, one input thereof connected to the connecting bus 72 between the register stacks 62 and 70 through a connecting bus 114 and the remaining input thereof connected to the I value that is provided by an external processor (not shown). The output of the multiplexer 110 is connected to the input of a multiplexer 125 through a connecting bus 116 and to the input of a multiplexer 127 through a connecting bus 118.

The output of the multiplexer provides the generated partial products $PP_1$ through $PP_4$ and these are input to the A-input of the fast adder 78 through a connecting bus 120. The multiplexer 125 provides the generated partial product $PP_1$ and this is input through a connecting bus 122 to one input of a multiplexer 124, the output of which is input to the B-input of the fast adder 78 through a connecting bus 126. The multiplexer 124 has the other input thereof connected to the connecting bus 80 to receive the sum output from the fast adder 78 and the output thereof connected the to the B-input of the fast adder 78.

The fast adder 78 has a third input labeled "C" which is connected to the output of a multiplexer 128. The multiplexer 128 has the inputs thereof connected to a digital word having all the bit positions occupied by a "0" and to the connecting bus 82 for receiving the carry output from the fast adder 78. The least significant bit (LSB) of the "0" value digital word is connected to the output of a circuit 129, the operation of which will be described hereinbelow. The multiplexer 128 is operable to select between the modified "0" digital word and the carry output of the fast adder 78. The operation of the fast adder 78 during performance of a multiplication operation will be described in more detail hereinbelow.

In the present embodiment, the outputs of both the full adder 44 and the fast adder 78 are, in one mode, circulated back to one of the inputs thereof. Utilization of combinational logic for addition operations would require some sort of latching circuit disposed on each of the adder inputs. In the preferred embodiment, however, dynamic NMOS technology is utilized which does not require an input latch to recirculate data. In dynamic NMOS devices, a four phase clock is utilized with each phase of the clock processing data through the circuit. For example, in a full adder, the first phase of the clock would cause the data to be loaded therein with the result being output from the adder on the fourth phase of the four phase clock. Therefore, the data on the output of the adder that is to be recirculated around to one input need only be there a sufficient amount of time to be loaded into the adder on the first phase of the clock. In a similar manner, loading into the delay registers is effected on the first phase of the four phase clock. This four phase clock is not illustrated and is an internal clock which is a required part of dynamic NMOS circuit. As described above, use of conventional combinational logic for the adders would require latched inputs and/or outputs.

Referring now to FIG. 3, there is illustrated a block diagram of the recode logic circuitry with the K stack 90, wherein like numerals refer to like parts in the various Figures. The data bus 92 that is output from the K stack 90 represents two data buses, data bus 92' and data bus 92''. Data bus 92'' is separated from data bus 92' by a one stage delay stack 130. The return data bus 102 is interconnected with the delayed data bus 92''. The eight bit wide input data bus 100 that is connected to the multiplexer 98 is comprised of a data bus 100' connected to the data bus 92' and a data bus 100'' connected to the data bus 92''. The data bus 96 that is input to the recode logic circuit 94 is divided into two data buses, a data bus 96' connected to the data bus 92' and a data bus 96'' connected to the data bus 92''.

The multiplexer 98 which receives the eight bit wide input from the data bus 100 is comprised of a multiplexer 132 and a multiplexer 134. The multiplexer 132 selects between the data buses 100' and 100'' and is controlled by the clock signal $T_{ODD}$. The operation of the control signal $T_{ODD}$ will be described in more detail hereinbelow. The output of the multiplexer 132 is an eight bit wide digital value and these eight bits are input to the multiplexer 134. The multiplexer 134 has four two bit inputs labeled "1", "2", "3", and "4" for receiving each two bits of the eight bit number output by the multiplexer 132. The multiplexer 134 is controlled by timing signals $t_1$, $t_2$, $t_3$ and $t_4$, which determine the length of time that the multiplexer has the "1", "2", "3" and "4" inputs, respectively, connected to the output thereof. The operation of the timing signals $t_1$–$t_4$ will be described in more detail hereinbelow. The output of the multiplexer 134 is a two bit output that is output on a two bit wide data bus 136.

Prior to inputting the two bit wide signal output by the multiplexer 134 into the recode logic circuit 108, the two bit signal is branched to both a two bit wide data bus 138 and a two bit wide data bus 140 for input to a multiplexer 142. The data bus 138 is input to the "0" input of a multiplexer 142 and the data on the data bus 140 is processed through an inverter bank 144 for input to the "1" input of the multiplexer 142. The multiplexer 142 is controlled by the $T_{ODD}$ signal to select either the direct data from the data bus 138 at the "0" input thereof or the inverted data on the bus 140 at the "1" input thereof for output onto the two bit wide data bus 109. As will be described hereinbelow, the $T_{ODD}$ signal selects either a positive or negative sign for the multiplier depending upon the operation to be performed. As can be seen from Equations 1–20, calculation of the Y-values in Equations 1–10 requires a subtraction operation.

The data contained on the two bit wide data buses 96' and 96'', consisting of the first two bits of the ten bit data word on the data buses 92' and 92'', respectively, is multiplexed through a multiplexer 146 for output to a two bit wide data bus 148. The data bus 148 is input to two branching data buses 150 and 152. The data bus 150 is input to the "0" input of a multiplexer 154 and the data bus 152 is input to the "1" input of the multiplexer 154 through an inverter bank 156. The multiplexer 154 is controlled by the $T_{ODD}$ signal to select the subtraction operation, similar to the operation of the multiplexer 142. The output of the multiplexer 154 is connected to the input of the recode logic circuit 94 through a two bit wide data bus 158.

In the preferred embodiment, the algorithm utilized to perform the multiplication is a modified Booth's algorithm, as described above. The modified Booth's algorithm requires the generation of modified Booth's operators that determine the operation that is to be performed on the multiplicand in order to generate the respective partial products. The operators are "0", "+1", "−1", "+2" and "−2". The operator "0" causes the partial product to be set to zero. The operator "+1" causes the partial product to equal the multiplicand whereas the operator "−1" causes the two's complement of the multiplicand to be generated. The operator "+2" causes the multiplicand to be reproduced and shifted one bit to the left whereas the operator "−2" causes the two's complement of the multiplicand to be generated and shifted one place to the left. This shifting operation will be described in more detail hereinbelow.

In generating the modified Booth's operators, it is necessary to examine the bits of the multiplier. These are examined in groups of three. The first group of three is comprised of bits one and two and also an implied bit to the right of bit one. This implied bit is a "0" for a positive multiplier and a "1" for a negative multiplier. The next group of digits that is examined is bits three and four and also bit two, which is the overlapping bit with the first group. Each of the additional groups comprises the next two bits and the highest order bit of the previous group. The modified Booth operators are generated as shown in Table 2.

TABLE 2

| Three-Bit Group | | | |
| --- | --- | --- | --- |
| A | B | C | Operator |
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

In generating $PP_1$ with the recode logic circuit 94, the first two bits of the multiplier are examined in addition to an implied bit. As described above, the implied bit is "0" for a positive multiplier and "1" for a negative multiplier. The recode logic circuit 108 is utilized to generate the remaining partial products $PP_3-PP_5$ in response to the two bit word selected by the multiplexer 134. To determine the overlap bit between the three bit groups of the multiplier, a multiplexer 160 is utilized. The multiplexer 160 selects between the highest order bit output by the multiplexer 154 and the highest order bit of the previous multiplier three bit group output from the multiplexer 142. The multiplexer 160 has the "1" input thereof connected with the highest order bit of the bus 158 through a connecting line 162. The "0" input of the multiplexer 160 is connected to the highest order bit on the bus 109 through a connecting line 164 and a delay register 166. The delay register 166 delays input of the highest order bit for one cycle of the multiplexer 134 such that the data input to the recode logic circuit 108 is the overlap bit from the previous multiplier segment.

In operation, the multiplexers 132 and 146 select the multiplier on either of the buses 92' or 92" for output therefrom. For a ten bit multiplier, five partial products must be generated and, therefore, four passes will be required. Each of these passes, respectively, occurs during the time periods labeled $t_1, t_2, t_3,$ and $t_4$. During $t_1$, the modified Booth's operators for $PP_1$ and $PP_2$ are generated. The modified Booth's operators for $PP_3$ are generated during $t_2$, $PP_4$ generated during $t_3$ and $PP_5$ generated during $t_5$.

During time period $t_1$ when the modified Booth's operators are generated for $PP_1$ and $PP_2$, the multiplexer 134 selects the third and fourth bit of the multiplier input to the first input thereof to the recode logic circuit 108. The multiplexer 160 selects the highest order bit from the input data to the recode logic circuit 94 for input as the overlap bit to the recode logic circuit 108. During the next three time periods $t_2-t_4$, the remaining bits of the multiplier are selected by the multiplexer 134 and input to the recode logic circuit 108. For each of these groups, the overlap bit is the delayed highest order bit from the previously selected group to allow generation of $PP_3, PP_4$ and $PP_5$. If the operation to be performed is a subtraction, the sign of the multiplier is changed. As described above, this is facilitated by generation of the $T_{ODD}$ signal and selection of the inverted multiplier bits by the multiplexers 142 and 154.

Referring now to FIG. 4, there is illustrated a schematic block diagram of the fast adder 78 and the multiplexers that are connected to the inputs thereto wherein like numerals refer to like parts in the various Figures. Prior to describing the operation of the fast adder 78, it will be necessary to describe the multiplication operation utilizing a fast adder for generating a sum and carry word and a full adder for adding this accumulated sum and carry word. This example is illustrated in Table 3 utilizing a multiplier with a value of "−167" and a multiplicand with a value of "6862".

TABLE 3

|     |     |     |     |
| --- | --- | --- | --- |
|     | 0.11010110011100 | = 13724 | *2**(−14) |
|     | 1.101011001 | = ×(−167) | *2**(−9) |
| $PP_1$ | 000000000011010110011100 | +1 | |
| $PP_2$ | 1111111001010011001000 | −2 | |
| $PP_3$ | 00000110101100111000 | +2 | |
| $PP_4$ | 000011010110011100 | +1 | |
| $PP_5$ | 1100101001100100 | −1 | |
|     | 11.10111010000011100111100 | = −2291908 | *2**(−23) |
| $PP_1$ | 000011010110011 100 | +1 | |
| $PP_2$ | 100101001100011 0 | −2 | |
| $+C_0$ | 000000000000000 00 | | |
| $\Sigma_1$ | 100110011010000 | | |
| $C_1$ | 000010001000111 | | |
| $\Sigma_1$ | 111001100110100 00 | | |
| $PP_3$ | 011010110011100 0 | +2 | |
| $+C_1$ | 000000100010001 11 | | |
| $\Sigma_2$ | 100011110111001 | | |
| $C_2$ | 110001000101000 | | |
| $\Sigma_2$ | 111000111101110 01 | | |
| $PP_4$ | 001101011001110 0 | +1 | |
| $+C_2$ | 001100010001010 00 | | |
| $\Sigma_3$ | 111001110101010 | | |
| $C_3$ | 011000110011100 | | |
| $\Sigma_3$ | 111110011101010 10 | | |
| $PP_5$ | 110010100110001 1 | −1 | |
| $+C_3$ | 000110001100111 11 | | |
| $\Sigma_4$ | 001010110111100 | | |
| $C_4$ | 101100011000111 | | |
| $\Sigma_4$ | 001010110111100 | | |
| $C_4$ | 101100011000111 | | |
| $\Sigma_{COR}$ | 0 | | |
| $\Sigma$ | 1.10111010000011 | | |

In Table 3, the multiplicand is represented as a fifteen bit didital word with the most significant bit (MSB) being equal to a logic "0". The multiplier is a ten bit digital word with the MSB being equal to a logic "1". Addition of the multiplicand and multiplier are illustrated by two methods. The first method illllustrates the "long hand" method for multiplying the multiplicand and multiplier by the modified Booth's algorithm. The long hand method first requires generation of the partial product $PP_1-PP_5$. The multiplier is examined to generate the modified Booth's operators for each partial product. In this example, the modified Booth's operator for $PP_1$ is "+1", the operator for $PP_2$ is "−2", the operator for $PP_3$ is "+2", the operator for $PP_4$ is "+1" and the operator for $PP_5$ is "−1". As described above, each of the operators determines the operation to be performed on the multiplicand. In addition to the operation performed on the multiplicand, the partial products must be shifted two places to the left with respect to the previous partial product prior to addition thereof. As illustrated, the sign bit for each of the partial products is extended to the left with the sign bit for $PP_1$ extended nine bits, the sign bit for $PP_2$ extended seven bits, the sign bit for $PP_3$ extended five bits, the sign bit for $PP_4$ extended three bits and the sign bit for $PP_5$ extended one bit. By conventional methods, the result is a twenty-five bit number of which only the fifteen most significant bits are output.

When using a fast adder, the first and second partial products are added to generate a sum and carry word and then the remaining partial products sequentially added to the sum and carry words to generate intermediate sum and carry words for addition to subsequent partial products. The final accumulated sum and carry words are then added in the full adder 44 to provide a final result. To add the first and second partial products, only fifteen bits are required, since the fast adder is a fifteen bit wide input. It is therefore necessary to truncate two or three bits off of $PP_1$ and possibly one bit off of $PP_2$ depending on the recode operations, since $PP_2$ is shifted two bits to the left with respect to $PP_1$. The digital value for $PP_1$ is equal to the digital value for the multiplicand since the modified Booth's operator is a "+1". However, $PP_2$ has a modified Booth's operator equal to "−2" and this requires generation of the two's complement and a shift of one bit to the left. However, in the preferred embodiment only the inverted digital word is shifted one bit to the left with the required "1" added in at a later time, as will be described hereinbelow. For addition of $PP_1$ and $PP_2$, the carry input is connected to a "0" value digital word. The generated values are $\Sigma_1$ and $C_1$ on the sum out and carry out of the fast adder 78. This summation occurs during the first pass during $t_1$.

During the next pass $t_2$, the value for $\Sigma_1$ and $C_1$ are shifted two places to the right and input to the fast adder in addition to the value for $PP_3$. Processing of these values through the fast adder results in the output of $\Sigma_2$ and $C_2$ from the sum and carry outputs, respectively. This is continued for the summation of $PP_4$ and for summation of $PP_5$. The final output from the fast adder 78 is the accumulated sum $\Sigma_4$ and the accumulated carry $C_4$. As will be described hereinbelow, the truncated bits from each of the operations are added to generate a carry forward which, if equal to the logic "1", forces the least significant bit of the carry word in each addition operation during each pass to a logic "1" to thereby account for any errors due to truncation.

The final result is obtained by adding the value of $\Sigma_4$ and $C_4$ in the fast adder with an additional correction bit $\Sigma_{COR}$ which results from addition of the truncated bits in the first four passes through the fast adder. The addition of this correction bit will be described in more detail hereinbelow.

The modified Booth's operations are performed by the multiplexers 125 and 127 in response to the operator output from the recode logic circuits 94 and 108, respectively. For the operation of "+1" and "−1", a relative shift of one place to the right with respect to the operator "+2" or "−2" is required. This shift is provided by a shifting block 170 which is connected in series with the data bus 118. The shifting block 170 can be "hardwired". The output of the shifting block 170 is input to the "1" input of the multiplexer 127 and, when selected, passes the data directly therethrough. The output of the shifting block 170 is also input to the "−1" input of the multiplexer 127 through an inverter bank 172 to provide inversion of the data. For the "+2" and "−2" operations, no shift is required. This is represented by feeding bus 118 directly to the "+2" input of multiplexer 127 and also input thereto through an inverter bank 176. Selection of any of the four inputs of the multiplexer 127 provides the desired inversion and shift of the input data.

The data that is input to the B-input of the fast adder 78 is controlled by the multiplexer 125. To provide the correct shift, the data bus 116 is input to either a shifting block 178 to arithmetically shift right the bits three bits to the right wherein the sign bit is extended and labeled "ASR3" or a shifting block 180 labeled "ASR2" to provide a shift of two bits to the right. As described above, this shift is utilized in the first pass during time $t_1$ for addition of $PP_1$. The output of the shifting block 170 is connected directly to the "+1" input of the multiplexer 125 and also to the "−1" input thereof through an inverter bank 182. The output of the shifting block 180 is connected to the "+2" input of the multiplexer 125 and also the "−2" input thereof through an inverter bank 184.

The multiplexer 124 has one input labeled "1" and a second input labeled "2-4". The first input is for selection during time period $t_1$ and the second input is selected during time period $t_2$-$t_4$. During the time periods $t_2$-$t_4$, the second input is selected which is connected to the sum output of the fast adder 78 through the data bus 80. In order to provide the relative two bit shift, this sum is shifted by two bits to the right, as represented by a shifting block 186 labeled "ASR2". This shift is facilitated by hardwiring the input bus to the multiplexer 124 by two bits to the right with respect to the data bus 80. The multiplexer 128 is also configured similar to the multiplexer 124 with one input thereof labeled "1" for receiving a modified "0" value digital word and a second input thereof labeled "2-4" for receiving the carry output from the fast adder 78. A shift is also required for the feedback value of the carry output and this is provided by a shifting block 188 labeled "ASR2". Since both the, sum output and carry output of the fast adder 78 have been shifted by the shifting blocks 186 and 188, it is necessary to extend the sign bit. Although this is not shown, logic is utilized to reproduce a logic "0" value and logic "1" value, depending upon the bit to be extended.

Referring further to FIG. 1, a bit correction circuit 190 is interfaced with the fast adder 78 and full adder 44 to account for any errors due to the truncation of bits in the four passes through the fast adder 78. The bit correction circuit 190 also adds in the logic "1" that was required for generating the two's complement for the modified Booth's operators "−1" and "−2". The bit correction circuit 190 outputs a $\Sigma_{COR}$ bit that is input to the carry input of the full adder 44 along a single bit line 192 and also outputs a carry bit into the least significant bit of the carry word output by the fast adder 78. This is effected by connecting the least significant bit of the generated carry word to the carry output of the bit correction circuit 190, as will be described hereinbelow.

Referring now to FIG. 5, there is illustrated a schematic block diagram of the bit correction circuit 190 and the interfacing circuitry to the system of FIG. 2. The bit correction circuit 190 has five data inputs which receive the truncated bits from each of the partial product sums described in Table 2. As described above, the first addend in each summation in the fast adder 78 has the least significant bits thereof truncated. Of these truncated bits, the two most significant are input to the bit correction circuit 190 at the inputs labeled "$A_1$" and "$A_0$" with "$A_0$" being the least significant of the two bits. The inputs "$A_1$" and "$A_0$" are connected through a pair of data lines 194 to the output of the multiplexer 127 to receive the two truncated bits therefrom. Therefore, the multiplexer 124 selects the data from the output of the multiplexer 125 which is $PP_1$ or the summed output of the fast adder 78.

The second addend in each of the four passes with the fast adder 78 has one bit truncated therefrom. This bit is input to the $B_1$ input of the bit correction circuit 190. To generate this truncated bit, the least significant bit (LSB) from the multiplicand is input to the "+1" input of a multiplexer 196 and also input to the "−1" input thereof through an inverter 198. The multiplexer 196 also has an input labeled "+2". The control signal for the multiplexer 196 is received from the recode logic circuit 108 along a four bit bus 200. The output of the recode logic circuit 108 determines which input of the multiplexer 196 is connected to the $B_1$ input of the bit correction circuit 190. The output of the recode logic circuit 108 is also input to the bit correction circuit 190 on a two bit data bus 202 for inputting the modified Booth's operators "−1" and "−2" thereto, the operation of which will be described hereinbelow.

The LSB of the multiplicand is also input to one input of an AND gate 204 through an inverter 206. The other input of the AND gate 204 is connected to the "−1" output of the recode logic circuit 94. The output of the AND gate 204 is connected to one input of an OR gate 207, the other input of which is connected to the "−2" output of the recode logic circuit 94. The output of the OR gate 207 is connected to the "1" input of a multiplexer 208. The multiplexer 208 has the other input thereof labeled "0" and is connected to the LSB of the carry output of the bit correction circuit 190. The output of the multiplexer 208 is connected to the $C_0$ input of the bit correction circuit 190. The $C_1$ input of the bit correction circuit 190 is connected to the output of a multiplexer 210 which has the "1" input thereof connected to a logic "0" and the "0" input thereof connected to the second carry bit output by the bit correction circuit 190. The multiplexers 208 and 210 are controlled by the $t_1$ signal to select the "1" input thereof during the first pass, wherein $PP_1$ and $PP_2$ are added, and to select the "0" input for the remaining passes through the fast adder 78.

The $C_0$ and $C_1$ inputs of the bit correction circuit 190 correspond to the two truncated bits from the shifted carry out signal from the fast ader 78. The AND gate 204 and the OR gate 207 in combination with the inverter 206 are operable to generate the correct two's complement of the first partial product by adding in a one if necessary.

The circuit 129 of FIG. 2 is represented by a dotted line and consists of the OR gate 207, the AND gate 204 and the inverter 206. The circuit 129 functions to force the lease significant carry fed to the bit correction logic to a logic "1" when a "−1" or "−2" operator is generated for operation on the milliplicand during eneration of $PP_1$. The output is automatically a logic "1" for the "−2" operator. If the lease significant bit is a logic "0" and a "−1" operator is required, then the output is again a logic "1". This feature guarantees that the correct two's complement of the mutiplicand is generated when required. The two's complement is obtained by inverting the bits and adding a logic "1".

Referring now to FIG. 6, there is illustrated a schematic diagram of the bit correction circuit 190 which is comprised of a full adder 212 and a half adder 14. The full adder 212 has three inputs labeled "A", "B" and "C". The A-input corresponds to the $A_1$ input of the bit correction circuit 190, the B-input corresponds to the $B_1$ input of the bit correction circuit 190 and the C-input is connected to the output of an AND gate 215. The AND gate 215 has one input representing the $A_0$ input of the bit correction circuit 190 and the other input thereof representing the $C_0$ input. The full adder 212 has a Σ output and a carry output $C_0$ to provide the carry signal. The Σ output of the full adder 212 is connected to the B-input of the half adder 214. The A-input of the half adder 214 represents the $C_1$ input of the bit correction circuit 190. The half adder 214 provides a sum output and a carry output with the sum output thereof connected to a node 216 and the carry output thereof connected to a node 218. The node 218 is input to one input of a three input AND gate 220 and also to one input of an AND gate 222. The "−1" signal is input to the other input of the AND gate 222 and to one input of the AND gate 220. The output of the AND gate 220 is input to a three input OR gate 224 and the output of the AND gate 222 is connected to the one input of a four input OR gate 226.

The other input of the AND gate 222 is connected to the output of an OR gate 228 which has one input thereof connected to the carry output of the half adder 214 and the other input thereof connected to the carry output of the full adder 212. The carry outputs of both the half adder 214 and the full adder 212 are connected to the inputs of the OR gate 226. The output of the OR gate 224 is connected to one input of an AND gate 230 which has the other input thereof connected to the "−2" input signal and the output thereof connected to the input of the OR gate 224. An AND gate 232 has one input thereof connected to the carry output of the half adder 214, the other input thereof connected to the carry output of the full adder 212 and the output thereof connected to the input of the OR gate 224. The output of the OR gate 224 is the $\Sigma_{COR}$ signal and the output of the OR gate 226 is the $C_{OUT}$ signal.

The AND gate 215 adds the numbers $A_0$ and $C_0$ to provide a carry for addition of the digits $A_1$ and $B_1$. $C_1$ is added in the half adder 214. This addition is illustrated in Table 4.

TABLE 4

| $A_1A_0$ | 11 |
|---|---|
| $B_1$ | 1 |
| $+C_1C_0$ | 11 |
| | 1 000 |
| | +1 |
| | 1 010 |

In Table 4, an example is provided utilizing all logic "1" values for the inputs. In addition, the modified Booth's operator for partial product corresponding to $B_1$ is equal to "−1". The result of adding the five digits is the generation of a carry out signal of "1 0". In addition, to generate the inverted signal, a logic "1" has to be added. This results in a sum of "1 0" with both the $C_{OUT}$ and $\Sigma_{COR}$ signals equal to a logic "1". This results in the LSB of the carry out signal from the adder 78 being forced to a logic "1" for the particular pass. If the $\Sigma_{COR}$ signal is a logic "1" for the first three passes, it is discarded. On the fourth pass, this value is added into the carry input of the full adder 44 on the line 192 to provide a sum correction bit. Therefore, the bit correction circuitry counts for a generated carry that results from summation of the truncated bits. In addition, a sum correction bit is generated for the final addition of the accumulated sum and carry words from the fast adder 78.

Referring now to FIG. 7, there is illustrated a schematic block diagram of the system timing circuit for generating appropriate timing pulses. A system clock 236 generates a stable output frequency of approximately 3.57 MHz, the output of which is connected to the input of a divide-by-four circuit 238. The output of the divide-by-four circuit 238 is a frequency of 880 kHz and this constitutes the fast clock "FC". FC is input to a logic circuit 240 to generate the timing pulses $t_1-t_4$. Each of the time periods $t_1-t_4$ has a repetition rate of 880 kHz and a duration equal to one-fourth of the clock period of FC.

The output of the divide-by-four circuit 238 is also input to a divide-by-four circuit 242 to generate the slow clock signal "SC" of 220 kHz. The SC signal is input to an inverter 244 to generate the inverted clock signal which is utilized as $T_{ODD}$ since the leading edge is 180° out of phase with SC. The divide-by-four circuit 242 is input to a divide-by-twenty-two circuit 246 to generate the SAMPLE clock signal of 10 kHz. This clock generates a sample time which is the amount of time required to process all twenty of the equations in Table 1 and output a representative value in the Y-register 48. The output of the divide-by-twenty-two circuit 246 and the SC signal are input to a logic circuit 248 to generate the T-times $T_1-T_{22}$. Each of the T-times represents 1/22 of the 10 kHz sample clock.

Referring further to FIG. 1 and Table 5 hereinbelow, the operation of this system will be described in more detail regarding data flow and timing.

TABLE 5

| T TIME | SN | MX | MD | ADDER A | ADDER B | OP | Σ | TAP 2 | TAP 3 | Y LATCH | TAP 1 |
|---|---|---|---|---|---|---|---|---|---|---|---|
| $T_1$ | − | E | $-I_i$ | $k2Y2'_{i-1}$ $b2_{i-2}$ | C' $k2Y2_{i-1}$ | + | $Y1_{i-1}$ $k2Y2_{i-1}$ | $b11_{i-1}$ | $b2_{i-2}$ | $Y1_{i-1}$ | $b4_i$ |
| $T_2$ | + | k1 | $Y1_{i-1}$ | $EI'_i$ 0 | C' $EI_i$ | + | $b3_{i-1}$ $EI_i$ | $b11_{i-1}$ | $b2_{i-2}$ | $y1_{i-1}$ | $Y1_{i-1}$ |
| $T_3$ | − | k10 | $b10_{i-1}$ | $k1Y1'_{i-1}$ $b1_{i-2}$ | C' $k1Y1_{i-1}$ | + | $EI_i$ $k1Y1_{i-1}$ | $b10_{i-1}$ | $b1_{i-2}$ | $Y1$ | $b3_{i-1}$ |
| $T_4$ | + | E | $EI_i$ | $k10b10'_{i-1}$ $EI_i$ | C' $k10b10_{i-1}$ | + | $b2_{i-1}$ $k10b10_{i-1}$ | $b10_{i-1}$ | $b1_{i-2}$ | $Y1_{i-1}$ | $EI_i$ |
| $T_5$ | − | k9 | $b9_{i-1}$ | $E-EI'_i$ $b11_{i-1}$ | C' $E-EI_i$ | + | $Y10_i$ $E-EI_i$ | $b9_{i-1}$ | $b11_{i-1}$ | $Y1_{i-1}$ | $b2_{i-1}$ |
| $T_6$ | + | k10 | $Y10_i$ | $k9b9'_{i-1}$ $Y10_i$ | C' $k9b9_{i-1}$ | + | $k9b9_{i-1}$ | $b9_{i-1}$ | $b11_{i-1}$ | $Y1_{i-1}$ | $Y10_i$ |
| $T_7$ | − | k8 | $b9_{i-1}$ | $k10Y10'_{i-1}$ $b10_{i-1}$ | C' $k10Y10_i$ | + | $Y9_i$ $k10Y10_i$ | $b8_{i-1}$ | $b10_{i-1}$ | $Y1_{i-1}$ | $b1_{i-1}$ |
| $T_8$ | + | k9 | $Y9_i$ | $k8b8'_{i-1}$ $Y9_i$ | C' $k8b8_{i-1}$ | + | $b11_i$ $k8b8_{i-1}$ | $b8_{i-1}$ | $b10_{i-1}$ | $Y1_{i-1}$ | $Y9_i$ |
| $T_9$ | − | k7 | $b7_{i-1}$ | $k9Y9'_i$ $b9_{i-1}$ | C' $k9Y9_i$ | + | $Y8_i$ $k9Y9_i$ | $b7_{i-1}$ | $b9_{i-1}$ | $Y1_{i-1}$ | $b11_i$ |
| $T_{10}$ | + | k8 | $Y8_i$ | $k7b7'_{i-1}$ $Y8_i$ | C' $k7b7_{i-1}$ | + | $b10_i$ $k7b7_{i-1}$ | $b7_{i-1}$ | $b9_{i-1}$ | $Y1_{i-1}$ | $Y8_i$ |
| $T_{11}$ | − | k6 | $b6_{i-1}$ | $k8Y8'_i$ $b8_{i-1}$ | C' $k8Y8_i$ | + | $Y7_i$ $k8Y8_i$ | $b6_{i-1}$ | $b8_{i-1}$ | $Y1_{i-1}$ | $b10_i$ |
| $T_{12}$ | + | k7 | $Y7_i$ | $k6b6'_{i-1}$ $Y7_i$ | C' $k6b6_{i-1}$ | + | $b9_i$ $k6b6_{i-1}$ | $b6_{i-1}$ | $b8_{i-1}$ | $Y1_{i-1}$ | $Y7_i$ |
| $T_{13}$ | − | k5 | $b5_{i-1}$ | $k7Y7'_i$ $b7_{i-1}$ | C' $k7Y7_i$ | + | $Y6_i$ $k7Y7_i$ | $b5_{i-1}$ | $b7_{i-1}$ | $Y1_{i-1}$ | $b9_i$ |
| $T_{14}$ | + | k6 | $Y6_i$ | $k5b5'_i$ $Y6_i$ | C' $k5b5_{i-1}$ | + | $b8_i$ $k5b5_{i-1}$ | $b5_{i-1}$ | $b7_{i-1}$ | $Y1_{i-1}$ | $Y6_i$ |
| $T_{15}$ | − | k4 | $b4_{i-1}$ | $k6Y6'_i$ $b6_{i-1}$ | C' $k6Y6_i$ | + | $Y5_i$ $k6Y6_i$ | $b4_{i-1}$ | $b6_{i-1}$ | $Y1_{i-1}$ | $b8_i$ |
| $T_{16}$ | + | k5 | $Y5_i$ | $k4b4'_{i-1}$ $Y5_i$ | C' $k4b4_{i-1}$ | + | $b7_i$ $k4b4_{i-1}$ | $b4_{i-1}$ | $b6_{i-1}$ | $Y1_{i-1}$ | $Y5_i$ |
| $T_{17}$ | − | k3 | $b3_{i-1}$ | $k5Y5'_i$ $b5_{i-1}$ | C' $k5Y5_i$ | + | $Y4_i$ $k5Y5_i$ | $b3_{i-1}$ | $b5_{i-1}$ | $Y1_{i-1}$ | $b7_i$ |
| $T_{18}$ | + | k4 | $Y4_{i-1}$ | $k3b3'_i$ $Y4_i$ | C' $k3b3_{i-1}$ | + | $b6_i$ $k3b3_{i-1}$ | $b3_{i-1}$ | $b5_{i-1}$ | $Y1_{i-1}$ | $Y4_i$ |
| $T_{19}$ | − | k2 | $b2_{i-1}$ | $k4Y4'_i$ $b4_{i-1}$ | C' $k4Y4_i$ | + | $Y3_i$ $k4Y4_i$ | $b2_{i-1}$ | $b4_{i-1}$ | $Y1_{i-1}$ | $b6_i$ |
| $T_{20}$ | + | k3 | $Y3_i$ | $k2b2'_i$ $Y3_i$ | C' $k2b2_{i-2}$ | + | $b5_i$ $k2b2_{i-1}$ | $b2_{i-1}$ | $b4_{i-1}$ | $Y1_{i-1}$ | $Y3_i$ |
| $T_{21}$ | − | k1 | $b1_{i-1}$ | $k3Y3'_i$ $b3_{i-1}$ | C' $k3Y3_i$ | + | $Y2_i$ $k3Y3_i$ | $b1_{i-1}$ | $b3_{i-1}$ | $Y1_{i-1}$ | $b5_i$ |
| $T_{22}$ | + | k2 | $Y2_i$ | $k1b1'_{i-1}$ $Y2_i$ | C' $k1b1_{i-1}$ | + | $b4_i$ $k1b1_{i-1}$ | $b1_{i-1}$ | $b3_{i-1}$ | $Y1_{i-1}$ | $Y2_i$ |

In Table 5, the status of all of the stacks and the operations to be performed thereon is represented. At a given one of the T-times $T_1-T_{22}$, there is present a multiplier and a multiplicand in addition to the data output from the top of the one stage delay register 66, the seven stage register 62 and the two stage register 70. The data output from the one stage register 66 is referred to as TAP1, the data output by the seven stage register 62 is referred to TAP2 and the data output by the two stage register 70 is referred to as TAP3. As described above, the general operation performed during a given T-time is two-fold. First, the partial products for the next sequential T-time are processed by the fast adder 78 to provide an accumulated sum and carry word. Secondly, the full adder 44 receives the accumulated sum and carry words from the preceding T-time and generates the sum therefor followed by an addition with a previously stored parameter. The full adder 44 is performing these two addition steps simultaneous with the processing of the partial products by the fast adder 78.

Referring further to Table 5, the operation will be described in more detail. In T-time $T_1$, a given sample time is initiated. During this sample time, the multiplier E is selected from the K stack 90 and the multiplicand $-I_i$ is selected by the multiplexer 110. The sign of the multiplier is forced to negative since this is an odd T-time, as will be described hereinbelow. The fast adder 78 adds the partial products for these two values and outputs the result on the accumulated sum and carry outputs thereof. On the next sequential T-time $T_2$, the output of the K stack 90 is k1 and the multiplier is selected from TAP1 on the output of the register 66. As described above, the data on the output of the one stage register 66 was generated two slow clock cycles prior to $T_2$. The A-and B-inputs of the full adder 44 have the accumulated sum word $EI_i$ and the accumulated carry word C' loaded therein. The result of this addition is the product $EI_i$.

Although the summation is illustrated as being simultaneous with the loading of the A- and B-inputs, it should be understood that a certain amount of time is required to perform this addition. In the preferred embodiment, the circuitry utilized to realize the components in the system of FIG. 1 incorporate dynamic NMOS technology. This type of technology requires the generation of a four phase clock which must be sequenced through to provide the result. Therefore, the result is generated at the end of this four phase clock and appears on the output at the initiation of the next summation operation. In addition, it should also be understood that this technology loads the data into the input registers during the first phase of the four phase clock such that the data need not be present during the entire summation period.

During the second cycle of the addition operation in the fast adder 44 during $T_2$, the summation value $EI_i$ is loaded into the B-input and the digital word having a value of "0" is selected by the multiplexer 74 and loaded into the A-input. The summation result is $EI_i$ and is loaded into the one stage register 58 and then the slow clock incremented to initiate the T-time $T_3$. During $T_3$, the multiplier constant selected is k10 and the multiplier selected is $b10_{i-1}$. The multiplier is selected from TAP2 on the output of the seven stage register 62. The fast adder 78 generates the accumulated sum word $k10b10'_{i-1}$ and C' for the multiplier and multiplicand. During the first portion of $T_3$, the full adder 44 sums the accumulated carry word $k1Y1'_{i-1}$ and C' to provide the product $k1Y1_{i-1}$. During the second portion of $T_3$, the value $b1_{i-2}$ is extracted from TAP3 at the top of the two stage register 70 and the output of the full adder 44 is input to the B-input thereof. The result is $b2_{i-1}$ the result of Equation 19 of Table 1. Since this is an odd T-time, the sign of the multiplier is changed to negative such that a subtraction operation is performed. After generation of the result $b2_{i-1}$, it is input to the input of the one stage data register 58 with the multiplexer 50.

During the next T-time $T_4$, the output of the K stack 90 is E and the output of the multiplier is $EI_i$, which was selected from TAP1 at the output of the one stage data register 66. The fast adder 78 generates the accumulated sum and carry word for this multiplier and multiplicand, which is not utilized and is illustrated in T-time $T_5$ as a value which is not utilized and can be discarded. During the first half of the addition operation with the full adder 44 during $T_4$, the previously calculated vlaue $k10b10'_{i-1}$ and C' are added to provide the product $k10b10_{i-1}$ *which is an input to the input of the full adder 44. During the second half of the addition operation, the value of $EI_i$ is input to the* A-input of the full adder 44 to provide the sum $Y10_i$ in accordance with Equation 1. This value is then input to the one stage data register 58.

As can be seen in Table 5, each value for b1–b10 is delayed through the one stage register 58 in combination with the seven stage register 62 and the two stage register 70 to provide a delay until the next sample time. To facilitate this, it is necessary to increment the seven stage register 62 and the two stage register 70 on only the odd clock times $T_{ODD}$. This is facilitated by an AND gate 250, which has the output thereof connected to the clock inputs of both the seven stage register 62 and two stage register 70 and the inputs thereof connected to the odd T-times $T_1$–$T_{21}$ and the slow clock signal SC. For selection of the odd T-times, these signals are input to an eleven-input OR gate (not shown) with the output thereof representing only odd T-times.

As can be seen from the outputs of TAP2 and TAP3 in Table 5, the contents thereof only change at odd T-times. Therefore, a B-value generated at, for example, $T_4$ will be delayed one clock cycle by the one stage register 58 and fourteen clock cycles by the seven stage register delay 62 before appearing on the output of the seven stage register 62 at TAP2 during $T_{19}$. After a B-value has been generated, a Y-value is generated utilizing the previously calculated Y-value that has been delayed by two clock cycles with the one stage register 58 and one stage register 66 on the TAP1 output thereof. Since the seven stage register 62 is only clocked on odd T-times, the Y-values are not loaded therein.

The process continues until $T_{22}$, when the values for $k1b1'_{i-1}$ and C', previously calculated in $T_{21}$, are input to the fast adder 44 during the first half of the T-time. During the second half of $T_{22}$, $Y2_i$ is received from TAP1 on the output of the one stage register 66 and summed with the value $k1b1_{i-1}$ to generate $Y1_i$. The value for $Y1_i$ is then loaded into the Y-register 48. Since b1 is equal to $Y_1$, it is necessary to load b1 into the one stage register 58 at the correct time. This occurs after the summation operation during $T_5$ in which no results were achieved. This allows the $b1_{i-1}$ value from the previously generated $Y1_i$ value to be input after the $Y10_i$ value was input thereto.

During processing of the twenty equations during T-times $T_1$–$T_{22}$, the fast adder 78 and the full adder 44 are efficiently utilized such that neither is idle during processing by the other. The fast adder 78 is always processing a multiplier and a multiplicand to generate an accumulated sum and carry output while the full adder 44 is always summing the accumulated sum and carry words generated in a previous T-time in addition to summing the resulting product with an addend. With the data flow illustrated in Table 4, twenty-two processing operations are required. For a 10 kHz sample time, the repetition rate for each of the T-times is 220 kHz. During each T-time, four passes must be made through the fast adder 78, thus requiring a repetition rate of 880 kHz therefor. The full adder 44 processes two additions during a given T-time, thus requiring a repetition rate of 440 kHz. At these repetition rates, it is only necessary to realize in circuitry a fast adder having a response time commensurate with the 880 kHz repetition rate and a full adder commensurate with a 440 kHz response time. Full adders, as compared to fast adders, are more complicated since they must propagate carrys through additions of adjacent bits. By utilizing a fast adder at a higher frequency to assist multiplication with the full adder, fabrication of the required circuitry is simplified.

To select the multiplier values, it is necessary to select from either the input of the one stage delay 130 or from the output thereof. The data is clocked through the K stack 90 which is a eleven stage register stack on every odd clock cycle. To facilitate this, an AND gate 254 has the inputs thereof connected to the slow clock signal SC and the odd T-time $T_{ODD}$ with the output thereof connected to the clock input of K stack 90. The clock signal is also supplied to the one stage delay 130 through a line 256. The one stage delay 130 provides the eleventh stage of storage. The sequency of data through the K stack 90 is illustrated in Table 6.

TABLE 6

| T TIMES | | | | | | | | | | | TAP1 | TAP2 |
|---|---|---|---|---|---|---|---|---|---|---|---|---|
| 22 | 2 | 3 | 4 | 5 | 6 | 7 | 8 | 9 | 10 | | E | 1 |
| 1 | 2 | 3 | 4 | 5 | 6 | 7 | 8 | 9 | 10 | | E | 1 |
| 2 | 1 | 2 | 3 | 4 | 5 | 6 | 7 | 8 | 9 | 10 | | E |
| 3 | 1 | 2 | 3 | 4 | 5 | 6 | 7 | 8 | 9 | 10 | | E |
| 4 | E | 1 | 2 | 3 | 4 | 5 | 6 | 7 | 8 | 9 | | 10 |
| 5 | E | 1 | 2 | 3 | 4 | 5 | 6 | 7 | 8 | 9 | | 10 |
| 6 | 10 | E | 1 | 2 | 3 | 4 | 5 | 6 | 7 | 8 | | 9 |
| 7 | 10 | E | 1 | 2 | 3 | 4 | 5 | 6 | 7 | 8 | | 9 |
| 8 | 9 | 10 | E | 1 | 2 | 3 | 4 | 5 | 6 | 7 | | 8 |
| 9 | 9 | 10 | E | 1 | 2 | 3 | 4 | 5 | 6 | 7 | | 8 |
| 10 | 8 | 9 | 10 | E | 1 | 2 | 3 | 4 | 5 | 6 | | 7 |
| 11 | 8 | 9 | 10 | E | 1 | 2 | 3 | 4 | 5 | 6 | | 7 |
| 12 | 7 | 8 | 9 | 10 | E | 1 | 2 | 3 | 4 | 5 | | 6 |
| 13 | 7 | 8 | 9 | 10 | E | 1 | 2 | 3 | 4 | 5 | | 6 |
| 14 | 6 | 7 | 8 | 9 | 10 | E | 1 | 2 | 3 | 4 | | 5 |
| 15 | 6 | 7 | 8 | 9 | 10 | E | 1 | 2 | 3 | 4 | | 5 |
| 16 | 5 | 6 | 7 | 8 | 9 | 10 | E | 1 | 2 | 3 | | 4 |
| 17 | 5 | 6 | 7 | 8 | 9 | 10 | E | 1 | 2 | 3 | | 4 |
| 18 | 4 | 5 | 6 | 7 | 8 | 9 | 10 | E | 1 | 2 | | 3 |
| 19 | 4 | 5 | 6 | 7 | 8 | 9 | 10 | E | 1 | 2 | | 3 |
| 20 | 3 | 4 | 5 | 6 | 7 | 8 | 9 | 10 | E | 1 | | 2 |
| 21 | 3 | 4 | 5 | 6 | 7 | 8 | 9 | 10 | E | 1 | | 2 |

In Table 6, there are two outputs, one for TAP1 and one for TAP2. TAP1 represents the data on the data bus 92' and TAP2 represents the data on the data bus 92''. The multiplexers 132 and 146 select the data as illustrated by the underscored values. For example, for T-time $T_{22}$, the value of E is selected by multiplexers 132 and 146, as indicated by the underscored value, whereas the value for T-time $T_1$ is selected from TAP2 for a value of k1. The k1-k10 values are represented by numerals only. The K stack 90 is not clocked between $T_{22}$ and $T_1$ but, rather clocked after selection of the value during $T_1$.

Figure 8:
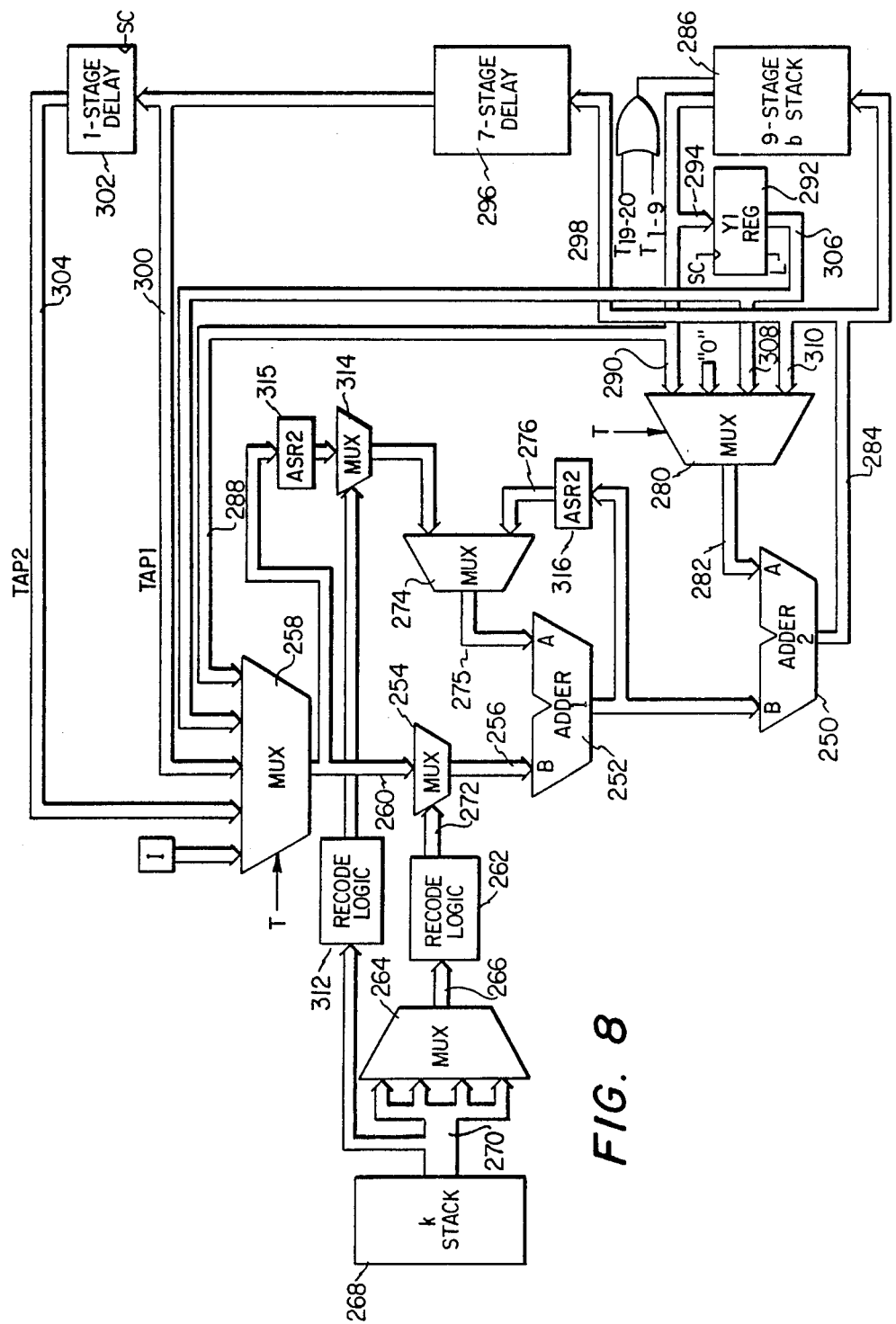
FIG. 8 illustrates an alternate embodiment of the present invention utilizing two full adders.

Referring now to FIG. 8, there is illustrated an alternate embodiment of the present invention utilizing two full adders. A full adder 250 is provided for receiving two digital signals on the A- and B-inputs thereof and generating a sum therefor. The adder 250 is similar to the adder 44 in that it performs only part of the equation involving the addend. A full adder 252 is provided for adding partial products. The B-input of the adder 252 is connected to the output of a multiplexer 254 through a data bus 256. The input of the multiplexer 254 is connected to the output of a multiplexer 258 through a data bus 260. The multiplexer 258 selects multiplicands for input to the multiplexer 254 for generation of partial products by the multiplexer 254.

A recode logic circuit 262 has the input thereof connected to the output of a multiplexer 264 through a two-bit wide data bus 266. The multiplexer 264 has four two-bit inputs for receiving a multiplier from a K-stack 268. The K-stack 268 is similar to the K-stack 90 in FIG. 2. The data contained in the K-stack 268 consists of ten-bit multiplier words that are output on a data bus 270 to the multiplexer 264. The output data bus 270 is divided up into five separate two-bit data buses for input to the four inputs of multiplexer 264 and to the input of a recode logic circuit 312. The multiplexer 264 is controlled by timing signals $t_1$–$t_4$. The timing signals $t_1$–$t_4$ correspond to the fast clock signals, as described above.

The output of the recode logic circuit controls a multiplexer 314 to generate partial products. The multiplexer 314 has the input thereof connected to the output of the multiplexer 258 through a shifting block 315.

The recode logic circuits 262 and 312 generate the modified Booth operators to output control signals to the multiplexers 254 and 314. During time period $t_1$, the first and second partial products are generated and, during time periods $t_2$–$t_4$, the remaining three partial products are generated. Each of these partial products is sequentially input to the B-input of the adder 252. This value is then added with the accumulated sums present on the A-input thereof. During time interval $t_1$, the first partial product which is routed to the A-input of the adder 252 is added to the second partial product which is routed to the B-input.

The A-input of the adder 252 is connected to the output of a multiplexer 274 through a data bus 276. The ASR block 315 functions to perform an arithmetic shift right of two bits on the accumulated sums output from adder 252. The multiplexer 274 has one input thereof connected to the output of the multiplexer 314 and the other input thereof connected to the output of the adder 252 through a shifted fifteen-bit data bus 276.

In performing a multiplication operation, the adder 252 firsts adds the first partial product with the second partial product and then sequentially feeds back the generated product to the multiplexer 274 and adds the remaining partial products therewith. As described above with reference to the multiplexing circuit of FIG. 4, the multiplexer 254 selects the data bits as a function of the modified Booth operation to be performed and the feedback data bus 276 supplies the accumulated sum shifted by two bits. At the end of the period $t_4$, the product is output by the adder 252 and into the B-input of the adder 250 through a fifteen-bit data bus 278. The adder 250 then adds the product on the B-input thereof with an addend on the A-input thereof. This addend is selected by a multiplexer 280 and output therefrom to the A-input of the adder 250 through the fifteen-bit data bus 282.

The output of the adder 250 is connected to a data bus 284 which is input to a nine-stage B-stack 286. The B-stack 286 is a first-in first-out stack of data registers utilized for delaying data stored therein. The output of the B-stack 286 is input to the multiplexer 258 on data bus 288 as a multiplicand and to the multiplexer 280 on a data bus 290 as an addend. The B-stack 286 also has the output thereof connected to the input of a Y1-register 292 on a data bus 294 for storing the $Y_1$ value.

The data bus 284 is also connected to a seven stage delay stack 296 through a data bus 298. The output of the seven stage delay stack 296 is connected to one input of the multiplexer 258 through a data bus 300 to provide delayed B-values as multiplicands. A one stage delay 302 has the input thereof connected to the output of the seven stage delay stack 296 to provide an additional stage of delay for the data. The output of the one stage delay 302 is connected to the input of the multiplexer 258 to provide delayed Y-values as multiplicands. In addition to the above described multiplicands, the output of the Y1-register 292 is also connected to the input of the multiplexer 258 on a data bus 306 to provide the $Y_1$ value as a multiplicand. The multiplexer 280 is also connected to the output of the Y1-register 292 through a data bus 308 to provide the $Y_1$ value as the multiplicand and also to a "0" value word.

During calculation of the Y- and B-values of Equations 1–20 in Table 1, the multiplication operation for a given value is generated simultaneous with any addition operation. Once the product has been generated, it is then input to the input of the adder 250 and then the calculation of the next product is initiated. During calculation of a product, the previous product is added with a select addend to generate the desired Y- or B-value. Therefore, the adder 250 operates at ¼ the rate of the adder 252 since four sums are generated with the adder 252, whereas only one sum is generated with the adder 250 during a given calculation.

To more clearly describe the data flow through the system of FIG. 8, data present during the various T-times is illustrated in Table 7.

TABLE 7

| Time | | | | Adder 1 | | | Adder 2 | | | Delay Stack | | b | Y1 |
|---|---|---|---|---|---|---|---|---|---|---|---|---|---|
| T | t | Mp | Mc | A | B | Σ | A | B | Σ | Tap 1 | Tap 2 | Stack | Reg |
| 1 | 1 | k7 | Y7 | $PP_1$ | $PP_2$ | $k8Y8_{i-1}$ | $b8_{i-2}$ | $k8Y8_{i-1}$ | $b10_{i-1}$ | $Y6_{i-1}$ | $Y7_{i-1}$ | $b8_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 2 | 1 | k6 | $Y6_{i-1}$ | $PP_1$ | $PP_2$ | $k7Y7_{i-1}$ | $b7_{i-2}$ | $k7Y7_{i-1}$ | $b9_{i-1}$ | $Y5_{i-1}$ | $Y6_{i-1}$ | $b7_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 3 | 1 | k5 | $Y5_{i-1}$ | $PP_1$ | $PP_2$ | $k6Y6_{i-1}$ | $b6_{i-2}$ | $k6Y6_{i-1}$ | $b8_{i-1}$ | $Y4_{i-1}$ | $Y5_{i-1}$ | $b6_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 4 | 1 | k4 | $Y4_{i-1}$ | $PP_1$ | $PP_2$ | $k5Y5_{i-1}$ | $b5_{i-2}$ | $k5Y5_{i-1}$ | $b7_{i-1}$ | $Y3_{i-1}$ | $Y4_{i-1}$ | $b5_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 5 | 1 | k3 | $Y3_{i-1}$ | $PP_1$ | $PP_2$ | $k4Y4_{i-1}$ | $b4_{i-2}$ | $k4Y4_{i-1}$ | $b6_{i-1}$ | $Y2_{i-1}$ | $Y3_{i-1}$ | $b4_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 6 | 1 | k2 | $Y2_{i-1}$ | $PP_1$ | $PP_2$ | $k3Y3_{i-1}$ | $b3_{i-2}$ | $k3Y3_{i-1}$ | $b5_{i-1}$ | $Y1_{i-1}$ | $Y2_{i-1}$ | $b3_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 7 | 1 | k1 | $Y1_{i-1}$ | $PP_1$ | $PP_2$ | $k2Y2_{i-1}$ | $b2_{i-2}$ | $k2Y2_{i-1}$ | $b4_{i-1}$ | $EI_i$ | $Y1_{i-1}$ | $b2_{i-2}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | " | " | " | " | |
| 8 | 1 | -k10 | $b10_{i-1}$ | $PP_1$ | $PP_2$ | $k1Y1_{i-1}$ | $b1_{i-2}$ | $k1Y1_{i-1}$ | $b3_{i-1}$ | $b10_{i-1}$ | $EI_{i-1}$ | $Y1_{i-1}$ | |
| | 2 | " | " | $\Sigma_1$ | $PP_3$ | $\Sigma_1$ | " | $\Sigma_1$ | " | " | " | " | |
| | 3 | " | " | $\Sigma_2$ | $PP_4$ | $\Sigma_2$ | " | $\Sigma_2$ | " | " | " | " | |
| | 4 | " | " | $\Sigma_3$ | $PP_5$ | $\Sigma_3$ | " | $\Sigma_3$ | | | | | |
| 9 | 1 | -k9 | $b9_{i-1}$ | $PP_1$ | $PP_2$ | $-k10b10_{i-1}$ | $EI_i$ | $-k10b10_{i-1}$ | $b2_{i-1}$ | $b9_{i-1}$ | $b10_{i-1}$ | $EI_{i-1}$ | $Y1_{i-1}$ |
| | 2 | " | " | $\Sigma_1$ | $PP_3$ | $\Sigma_1$ | " | $\Sigma_1$ | " | " | " | " | " |
| | 3 | " | " | $\Sigma_2$ | $PP_4$ | $\Sigma_2$ | " | $\Sigma_2$ | " | " | " | " | " |
| | 4 | " | " | $\Sigma_3$ | | $\Sigma_3$ | | | | | | | |
| | $PP_5$ | $\Sigma_3$ | " | $\Sigma_3$ | " | " | " | " | " | | | | |
| 10 | 1 | -k-8 | $b8_{i-1}$ | $PP_1$ | $PP_2$ | $-k9b9_{i-1}$ | $Y10_i$ | $-k9b9_{i-1}$ | $Y10_{i-1}$ | $b8_{i-1}$ | $b9_{i-1}$ | $b10_{i-1}$ | " |
| | 2 | " | " | $\Sigma_1$ | $PP_3$ | $\Sigma_1$ | " | $\Sigma_1$ | " | " | " | " | " |
| | 3 | " | " | $\Sigma_2$ | $PP_4$ | $\Sigma_2$ | " | $\Sigma_2$ | " | " | " | " | " |
| | 4 | " | " | $\Sigma_3$ | $PP_5$ | $\Sigma_3$ | " | $\Sigma_3$ | " | " | " | " | " |
| 11 | 1 | -k7 | $b7_{i-1}$ | $PP_1$ | $PP_2$ | $-k8b8_{i-1}$ | Y9 | $-k8b8_{i-1}$ | $Y9_{i-1}$ | $b7_{i-1}$ | $b8_{i-1}$ | " | " |
| | 2 | " | " | $\Sigma_1$ | $PP_3$ | $\Sigma_1$ | " | $\Sigma_1$ | " | " | " | " | " |
| | 3 | " | " | $\Sigma_2$ | $PP_4$ | $\Sigma_2$ | " | $\Sigma_2$ | " | " | " | " | " |
| | 4 | " | " | $\Sigma_3$ | $PP_5$ | $\Sigma_3$ | " | $\Sigma_3$ | " | " | " | " | " |
| 12 | 1 | -k6 | $b6_{i-1}$ | $PP_1$ | $PP_2$ | $-k7b7_{i-1}$ | $Y8_i$ | $-k7b7_{i-1}$ | $Y8_{i-1}$ | $b6_{i-1}$ | $b7_{i-1}$ | " | " |
| | 2 | " | " | $\Sigma_1$ | $PP_3$ | $\Sigma_1$ | " | $\Sigma_1$ | " | " | " | " | " |
| | 3 | " | " | $\Sigma_2$ | $PP_4$ | $\Sigma_2$ | " | $\Sigma_2$ | " | " | " | " | " |
| | 4 | " | " | $\Sigma_3$ | $PP_5$ | $\Sigma_3$ | " | $\Sigma_3$ | " | " | " | " | " |
| 13 | 1 | -k5 | $b5_{i-1}$ | $PP_1$ | $PP_2$ | $-k6b6_{i-1}$ | $Y7_i$ | $-k6b6_{i-1}$ | $Y7_i$ | $b5_{i-1}$ | $b6_{i-1}$ | " | " |

TABLE 7-continued

| Time | | | | Adder 1 | | | Adder 2 | | | Delay Stack | | b | Y1 |
|---|---|---|---|---|---|---|---|---|---|---|---|---|---|
| T | t | Mp | Mc | A | B | Σ | A | B | Σ | Tap 1 | Tap 2 | Stack | Reg |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 14 | 1 | −k4 | b4$_{i-1}$ | PP₁ | PP₂ | −k5b5$_{i-1}$ | Y6$_i$ | −k5b5$_{i-1}$ | Y6$_i$ | b4$_{i-1}$ | b5$_{i-1}$ | " | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 15 | 1 | −k3 | b3$_{i-1}$ | PP₁ | PP₂ | −k4b4$_{i-1}$ | Y5$_i$ | −k4b4$_{i-1}$ | Y5$_i$ | b3$_{i-1}$ | b4$_{i-1}$ | " | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 16 | 1 | −k2 | b2$_{i-1}$ | PP₁ | PP₂ | −k3b3$_{i-1}$ | Y4$_i$ | −k3b3$_{i-1}$ | Y4$_i$ | b2$_{i-1}$ | b3$_{i-1}$ | " | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 17 | 1 | −k1 | b1$_{i-1}$ | PP₁ | PP₂ | −k2b2$_{i-1}$ | Y3$_i$ | −k2b2$_{i-1}$ | Y3$_i$ | Y10$_{i-1}$ | b2$_{i-1}$ | " | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 18 | 1 | E | I$_{i-1}$ | PP₁ | PP₂ | −k1b1$_{i-1}$ | Y2$_i$ | −k1b1$_{i-1}$ | Y2$_i$ | Y9$_i$ | Y10$_i$ | " | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 19 | 1 | k9 | Y9$_i$ | PP₁ | PP₂ | EI$_{i-1}$ | 0 | EI$_{i-1}$ | Y1$_i$ | Y8$_i$ | Y9$_i$ | " | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |
| 20 | 1 | k8 | Y8$_i$ | PP₁ | PP₂ | k9Y9$_i$ | b9$_{i-1}$ | k9Y9$_i$ | EI$_{i-1}$ | Y7$_i$ | Y8$_i$ | b9$_{i-1}$ | " |
|  | 2 | " | " | Σ₁ | PP₃ | Σ₁ | " | Σ₁ | " | " | " | " | " |
|  | 3 | " | " | Σ₂ | PP₄ | Σ₂ | " | Σ₂ | " | " | " | " | " |
|  | 4 | " | " | Σ₃ | PP₅ | Σ₃ | " | Σ₃ | " | " | " | " | " |

In Table 7, there are 20 T-times $T_1$–$T_{20}$ required to calculate Equations 1–20 in Table 1. In T-time $T_1$, the value of k7 is present on the output of the K-stack 268 and Y7$_{i-1}$, which is supplied by TAP2 of the delay stock, is selected by the multiplexer 258 and is illustrated in the column labeled "Mc" to represent the multiplicand. The product is generated during $T_1$ and is input to the B-input of the adder 250 during T-time $T_2$ and $t_1$. The product generated is k7Y7$_{i-1}$ and this is utilized for calculating a B-value.

During T-time $T_2$, the product k7Y7$_{i-1}$ on the B-input of the adder 252 is added with the addend selected by the multiplexer 280. The addend is b7$_{i-2}$ which is on top of the B-stack 286. The operation is a summation operation and the result is b8$_{i-1}$, which appears on the output of the adder 250 during the next successive T-time $T_3$. For calculation of the remaining B-values up to b2$_{i-1}$, the addend is selected from the top of the B-stack and the multiplicand is selected from the one stage delay 302. However, during T-time $T_8$, b1$_{i-2}$ is equal to Y1$_{i-1}$ and is selected from the output of the Y1-register 292.

After calculation of the B-values, the value of Y10$_i$ is calculated utilizing the value of EI$_i$ stored in the B-stack 286 during T-time $T_9$. Thereafter, the Y-values are calculated. During calculation of the Y-values, the B-stack 286 is not shifted and the multiplicand is selected from TAP1 coming from the top of the seven stage delay 296 which consists of the delayed B-values. The addend is the previously calculated Y-value which is input to the multiplexer 280 on a data bus 310. Each of the Y-values is calculated until T-time $T_{18}$, wherein the value of Y1$_i$ is calculated. This value is clocked into the B-stack 286 at ther beginning of $T_{20}$ and is eventially loaded into the Y1-register 292 at $T_9$. In addition, the value of EI$_{i+1}$ is calculated during T-time $T_{19}$ and stored in the B-stack 286.

In summary, there has been provided a method and apparatus for processing data in a ten stage lattice filter.

To increase speed, partial products for the multiplication operation are added with a fast adder that accumulates the carry bits rather than propagate them. The partial products added are those for the multiplication operation of the next T-time. A full adder is then utilized to generate the product utilizing the results of the fast adder from the previous T-time. This product is then summed in the full adder with an addend to provide the additional addition or subtraction operation for a given equation. The fast adder operates simultaneous with the full adder such that neither is idle for any period of time. In this manner, the full adder need only operate at a fraction of the speed of the fast adder, resulting in less complicated circuitry.

Although the referred embodiment has been described in detail, it should be understood that various changes, substitutions and attentions can be made therein without departing from the spirit and scope of the invention as defined by the appended claims.

What is claimed is:

1. A digital lattice filter for processing a sequence of arithmetic operations each comprising a multipliction operation for generating a product followed by an addition operation for adding an addend to the the generated product, the digital lattice filter operating in accordance with a linear predictive coding technique, comprising:

storage means for storing arithmetic parameters for use in processing the arithmetic operations;
means for retrieving a select two of said
means for retrieving a elect two of said arithmetic parameters from said storage means as a multiplicand and multiplier, respectively, for a multiplication operation and a select one of said arithmetic parameters as an addend for an addition operation, said multiplicand, multiplier and addend selected for a given one of the arithmetic operations;

partial product means for generating the partial products of said selected multiplier and multiplicand in accordance with a predetermined multiplication algorithm;

fast adder means for adding the generated partial products of said selected multiplier and multiplicand generated by said parital product means to generate an accumulated sum word and an accumualted carry word;

adder means having first and second inputs for receiving two digital values and generating the sum thereof on an output;

control means for controlling the operation of said adder means to first add said accumulated sum word and said accumulated carry word to generate the product of said multiplier and multiplicand and sequentially add said addend to said generated product to provide a result for the given one of the arithmetic operations;

timing means for timing the operation of said fast adder mean and said control means to process the sequence of arithmetic equations in a predetermined number of cycles, ech cycle being of a predetermined length of time;

said fast adder means and said control means operating in a given one of the cycles of said timing means to generate the accumulated sum and the accumulated carry word for the next succesive arithmetic operation in the next successive cycle of said timing means simultaneous with generation of said product and said result for the arithmetic operation by said adder means and said control means corresponding to the given one of said cycles;

means for storing results of said adder means in said storage means as arithmetic parameters; and register means for storing the result of the arithmetic operation output by said adder means after the last cycle in the sequence.

2. The digital apparatus of claim 1 wherein said fast adder means comprises:

a fast adder having first, second and third inputs for adding two digital works and a carry word and generating on an accumulated sum output the sum word comprised of individual sum bits and on an accumulated carry output the cary word comprised of individual carry bits;

means for receiving the partial products of said multiplicand and multiplier generated by said partial product means;

first switch means for selectively inputting the received partial products to the first and second inputs of said fast adder;

second switch means for selectively connecting the accumulated carry output to the third input and the accumulated sum output to the second input; and means for controlling the operation of said first and second switch means to first generate the accumulated sum and carry words with the first two received partial products input to the first and second inputs of said fast adder and sequentially sum the remaining partial products with the generated sum and carry words to generate said accumulated sum and carry words.

3. The digital apparatus of claim 1 and further comprising means for altering the sign of said multiplier retrieved from said storage means to reflect a subtraction operation when said generated product is input to said adder means.

4. The digital apparatus of claim 1 and further comprising means for storing the results of each arithmetic operation in said storage means in accordance with a predetermined order such that the stored result is available for use in a successive arithmetic operation in a successive cycle from that in which said result is generated.

5. The digital apparatus of claim 1 wherein said storage means comprises:

a data register for storing multipliers in a predetermined order for output therefrom; and a delay register connected to the output of said adder for temporarily storing the result of a select arithmetic operation, said delay register having the output thereof selectively connected to the input of said partial product means to provide said multiplicand therefor or to the input of said adder means to provide said addend therefor, said data register and delay register controlled by said timing means.

6. The digital apparatus of claim 1 and further comprising means for externally altering select ones of the values of the arithmetic parameters stored in said storage means.

7. A digital lattice filter for processing a sequence of digital arithmetic operations in accordance with a linear predictive coding technique, each operation consisting of a multipliction of a multiplier and a multiplecand to generate a product and a subsequent addition of an addend with the generated product to yield an accumulated result, comprising:

multiplier storage means for storing digital multiplier constatns in a predetermined patern;

delay storage means having an input and a delayed output for receiving arithmetic parameters on the input for storage thereof and providing said stored arithmetic parameters on the delayd output thereof after a predetermined duration of time, said arithmetic parameters comprising multiplicands for multiplication operations with said multiplier, and addends for addition operations;

partial product means for retrieving said multiplicand from said delay storage means and said multiplier from said mulitplier storage means for a given one of the arithmetic operations and generating the partial products therefor in accordance with a predetermined multiplication algorithm;

fast adder means for receiving said partial products from said partial product means and generating the accumulated sum of the individual bits of said partial products on an accumulated sum output and the accumulated carry of the individual bits of said partial products on an accumulated carry output;

full adder means having first and second inputs for receiving two digital values and providing the sum therefor on an outupt;

means for selectively interfacing the first and second inputs of said adder means with the accumulated sum and carry outputs of said fast adder means to receive the accumulated sum and carry words output by said fast adder means and generate the sum therefor, said generated sum being a generated product of said multiplicand and multiplier for the given arithmetic operation;

said interface means for interfacing one of the inputs of said full adder means with said delay storage means to receive said addend from said delay storage means and the other input thereof with the output thereof to receive said generated product for addition of said generated product with said addend to produce a result for the given arithmetic operation being processed;

timing means for controlling the operation of said fast adder means, said partial product means and said interface means to process the sequence of arithmetic equations in cycles, each cycle being one stage of the lattice filter;

said fast adder means operating to generate the accumulated sum and carry words for the next sucessive arithmetic operation during the time said full adder is generating the result for a given arithmetic operation;

said timing means for controlling the operation of said multiplier storage means and said delay storage means to provide the multiplier, multiplicand and addend at the outputs thereof for the associated arithmetic operations, said timing means determining which of the parameters stored in said delay storage means are to be said multiplicand or said addend in accordance with the linear predictive coding technique;

means for inputting the results of the arithmetic operations in said delay storage means as arithmetic parameters; and register means for storing the result output by said full adder means corresponding to the final arithmetic operation performed in the sequence.

8. The apparatus of claim 7 and further comprising means for changing the sign of said generated product to reflect a subtraction operation when said addend is added to said generated product.

9. The digital apparatus of claim 7 wherein said multiplier storage means comprises a rotary data register for sequencing through the the predetermined order of multiplier constants for each sequence of arithmetic operations processed.

10. The apparatus of claim 7 wherein said delay storage means comprises:
a first register stack having the input thereof connected to the output of said full adder means for selectively receiving data and delaying said received data for a first predetermined number of cycles of said timing means for output from said first register stack;
a second register stack having the input thereof connected to the output of said full adder means for selectively receiving data and delaying said received data for a second predetermined number of cycles of said timing means for output from said second register stack; and
said first and second register stacks having the outputs thereof selectively interfaced with said partial product means and said interface means to provide either a multiplicand or an addend, therefor said arithmetic parameters output by said first and second delay stacks in accordance with line predictive coding technique.

11. The apparatus of claim 7 wherein said fast adder means comprises a fast adder having a parallel series of one bit adders for adding individual bits and generating a separate carry bit for each of the individual bits of the summed partial products without propagating the carry across the summed bits.

12. The apparatus of claim 7 wherein said predetermined multiplication algorithm is a modified Booth's algoithm and said partial product means comprises:

recode logic circuitry for receiving said multiplier and generating modified Booth operators associated with the partial product to be generated;

shifting means for shifting said multiplicand a predetermined number of bits in accordance with the generated modified Booth operator associated with each partial product; and complement means for selectively generating the two's complement of said multiplicand in response to the generated modified Booth operator when the generated modified Booth operator requires generation of the two's complement;

a partial product generated by selective shifting by said shifting means and selective generation of the two's complement by said complement means.

13. The apparatus of claim 7 wherein said full adder means comprises a digital full adder.

14. The apparatus of claim 7 wherein said interface means comprises:
a first switch having an output connected to the first input of said full adder means and two inputs selectively connectable to the output thereof, one input thereof connected to the accumulated sum output of said fast adder means and the other input thereof connected to the output of said delay storage means for receiving addends therefrom; and
a second switch having an output connected to the second input of said full adder means and two inputs selectively connectable to the output thereof, one input thereof connected to the accumulated carry output of said fast adder means and the other input thereof connected to the sum output of said full adder means for feedback of sum results.

15. The digital apparatus of claim 7 and further comprising means for changing the values of the multiplier constants stored insaid multiplier storage means.

16. The digital apparatus of claim 7 wherein said fast adder means comprises:
a three input fast adder for adding the individual bits of three digital values and generating on one output thereof a sum word having bits representative of the sum of each of the individual bits and a carry word on the other output thereof representative of the carry for each of the individual bits;
said fast adder having the first input thereof selectively connected to the output of said partial product means for receiving the second and remaining partial products for input thereto;
a first switch having the output thereof connected to the second input of said fast adder and having three inputs that are selectively connectable to the output thereof, one input thereof connected to the output of said partial product means for receiving the first partial product generated thereby and the remaining input thereof connected to the accumulated sum output of said fast adder; and
said fast adder having the carry output thereof connected to the third input thereof for allowing summation of the accumulated carry word with partial products generated by said partial product means.

17. The digital apparatus of claim 7 wherein said timing means comprises:
a fast clock for providing a time base for determining the duration of time for each addition of partial products by said fast adder means;
a slow clock for determining the duration of time for performing each of the arithmetic operations, the duration of time equal to the cycle of said timing means; and an addition clock for determining the duration of time for addition by said adder means to perform two additions during each cycle of said slow clock means.

18. The digital apparatus of claim 7 and further comprising:

means for truncating the partial products generaged by said partial product means to reduce the length of the digital word output from said fast adder means for both the accumulated sum word and the accumulated carry word; and means for correcting the result of adding the accumulated sum and carry words in said full adder means to account for truncation errors.

19. A method for processing a sequence of arithmetic operations each comprising a multiplication operation for generating a product followed by an addition operations for adding an addend to the generated product, the sequence processed in accordance with a linear predictive coding technique, comprising:

storing digital arithmetic parameters for use in processing the arithmetic operations;

retrieving a select two of the digital arithmetic parameters as a multiplicand and a multiplier, respectively for a multiplication operation and a select one of the digital arithmetic parameters as an addend for an addition operation;

generating the partial producst of the selected multiplier an dultiplicand in accordance with a predetermined multiplication algorithm;

adding the generated partial products to generate an accumulated sum word and an accumulated carry word, the accumulated sum word comprised of the summation of individual digital bits and the accumulated carry word comprised of digital carry bit for each of the accumulated digital sum bits;

providing an adder having first and second inputs for receiving two digital values and generating the sum thereof;

controlling the operation of the adder to first add the accumulated sum and carry words to generate the product of the multiplican and multiplier and sequentially adding the retrieved addend to the generated product to provide a result for a given one of the arithmetic operations;

timing the operation of the partial products summation and the additioin of the generated product and the retrieved addend with the adder to process the sequence of arithmetic operations and generate results therefor in a plurality of cycles, each cycle being the duration of time required for the summation of partial products and the duration of time to add the accumulated sum and carry words followed by addition of the addend;

the partial products summation and subsequent addition of the generated product and addend with the adder being simultaneous with the operation of summing partial products to generate the accumulated sum and carrY words for the next successive arithmetic operation, while generating the product and result for the given one of the arithmetic operations being processed;

the results of each of the arithmetic operations in the sequence stored as arithmetic parameters; and storing the result of the last of the arithmetic operations in the sequence in a register.

20. The method of claim 19 wherein the step of adding partial products comprises:

providing a fast adder having a first, second and third inputs for adding the bits of digital words and a carry word and generating both the accumulated sum word and the accumulated carry word; and multiplexing the operation of the fast adder to add the first two partial products with a zero value carry word and generate the sum and carry words therefor and sequentially sum the remaining partial products with intermediate sum and carry words to generate the accumulated sum and carry words.

21. The method of claim 19 and further comprising altering the sign of the multiplier to selectively reflect a subtraction operation with the adder.

22. The method of claim 19 wherein the results of each of the arithmetic operations are stored as the arithmetic parameters in accordance with a predetermined order such that the result is available for use in a subsequent arithmetic operation.

* * * * *